United States Patent [19]

Shinkawata

[11] Patent Number: 5,717,236

[45] Date of Patent: Feb. 10, 1998

[54] SEMICONDUCTOR MEMORY INCLUDING STACKED CAPACITOR HAVING A FLAT SURFACE

[75] Inventor: Hiroki Shinkawata, Hyogo, Japan

[73] Assignee: Mitsubishi Denki Kabushiki Kaisha, Tokyo, Japan

[21] Appl. No.: 538,480

[22] Filed: Oct. 3, 1995

[30] Foreign Application Priority Data

May 15, 1995 [JP] Japan ................... 7-115810

[51] Int. Cl.[6] .......................... H01L 27/108
[52] U.S. Cl. ................. 257/306; 257/308; 257/310; 257/626
[58] Field of Search ....................... 257/303, 306, 257/308, 310, 626

[56] References Cited

U.S. PATENT DOCUMENTS

| | | |
|---|---|---|
| 5,335,138 | 8/1994 | Sandhu et al. .............. 257/306 |
| 5,418,388 | 5/1995 | Okudaira et al. ............ 257/295 |
| 5,561,311 | 10/1996 | Hamamoto et al. ........... 257/306 |

OTHER PUBLICATIONS

IEEE, pp. 34.4.1–34.4.4, 1994, Shigeo Onishi, et al., "A Half–Micron Ferroelectric Memory Cell Technology with Stacked Capacitor Structure".

*Primary Examiner*—Minh-Loan Tran
*Attorney, Agent, or Firm*—Oblon, Spivak, McClelland, Maier & Neustadt, P.C.

[57] ABSTRACT

To enhance an electric characteristic of a capacitor by decreasing a leak current, and by eliminating a recess formed in the middle of a lower electrode. In order to cover a transistor, a first interlayer insulating film (10), and a second interlayer insulating film (11) as a stopper member of a CMP method thereon are sequentially formed, a contact hole (12) is formed, and the contact hole (12) is filled in by forming a polysilicon film. Polishing the polysilicon film by the CMP method, the second interlayer insulating film (11) is formed in a thickness of 30 to 100 nm. As a result, a polysilicon plug (14) with a flat upper surface free from recess is formed, and lower electrodes (15, 16) formed thereon are also films of uniform thickness without recess, so that recess is not formed either in the middle of a ferrodielectric film (21). Therefore, the sinking amount of an oxide film spacer (19) for framing a side surface of the lower electrodes (15, 16) is small, and forming of a metal wiring layer (24) is easier.

23 Claims, 23 Drawing Sheets

SEMICONDUCTOR MEMORY INCLUDING STACKED CAPACITOR HAVING A FLAT SURFACE

BACKGROUND OF THE INVENTION

1. Field of the Invention

The present invention relates to a semiconductor memory device such as DRAM and FRAM, and more particularly to a semiconductor memory device using a ferrodielectric film or high dielectric film in a stacked capacitor. The invention also relates to such stacked capacitor.

2. Description of the Background Art

In the latest DRAM (dynamic random access memory), as the cell area is reduced, by the three-dimensional capacitor structure using the conventional silicon oxide and nitride films (cylindrical type, fin type, trench type, etc.), the manufacturing process is complicate and difficult, and sufficient capacitor capacity cannot be obtained.

It is hence necessary to change the dielectric used in the capacitor to one of a larger dielectric constant. Such materials of high dielectric constant include high dielectric materials such as (Ba, Sr)TiO3, B aTiO3, and SrTiO3, and ferrodielectric materials such as PbTiO3, PbZrO3, LiNbO3, PZT, PLZT and other oxide ceramics. Herein, the high dielectrics refer to the dielectrics high in dielectric constant not showing hysteresis at room temperature. To use these dielectric films, as the electrode material to be used as the base layer for their crystal growth, metals such as Pt, Pd, Rh, Ni and W, alloys such as Pt, Pd, Rh, Ni and W, and metal laminate films such as Ru/RuO2 and Ir/IrO2 are necessary. As the barrier layer (diffusion inhibitory layer), Ti derivative laminate film such as TiN/Ti is necessary. Methods of fabricating these thin films include a sputtering method, a MOCVD method, and others.

FIG. 33 is a sectional view showing the structure of a DRAM having the capacitor of stack structure using such a ferrodielectric film or high dielectric film. In the diagram, reference numeral 1P is a semiconductor substrate, 2P is a field oxide film, 3P is an impurity region, 4P is a diffusion layer, 5P is a gate oxide film, 6P is a gate electrode, 7P is an insulating film, 9P is a bit wiring layer, 10P is an interlayer insulating film such as silicon oxide film, 12P is a contact hole, 14P is a plug made of a polysilicon film for filling in the contact hole 12P, 15P is a barrier layer, 16P is a lower electrode (Pt, etc.) of a stacked capacitor, 19P is a spacer of silicon oxide film, 21P is a ferrodielectric film or high dielectric film, 22P is an upper electrode (Pt, etc.) of the stacked capacitor, 23P is an interlayer insulating film, and 24P is a metal wiring layer. The polysilicon plug 14P is formed by forming a polysilicon film in the contact hole 12P formed in the interlayer insulating film 10P and on an upper surface of the interlayer insulating film 10P, and further by etching this polysilicon film.

Other prior art is disclosed in FIG. 3 in the U.S. Pat. No. 5,335,138. In this structure, a gap between lower electrodes of adjacent capacitors shown in FIG. 33 is buried in a flat insulating film having a same film thickness as the sum of both film thicknesses of the lower electrode and the barrier layer beneath it. At this time, the insulating film is formed by evaporating an insulating film on the lower electrode and in the gap, and removing this film up to an upper surface of the lower electrode by employing a CMP (chemical mechanical polishing) method.

When applying a crystalline material of a ferrodielectric thin film or high dielectric thin film in a stacked capacitor (hereinafter capacitor) of the DRAM, it is necessary to decrease a local step difference occured by its structure and manufacturing process. The reason is that the crystallinity of the ferrodielectric thin film or high dielectric thin film is formed unequally in such local step difference, and a leak current of the film increases in such area, so that the electric characteristic of the capacitor deteriorates. In particular, when these dielectric films are formed by a sputtering method, it is highly possible that thinning of film occurs in the local step difference, and hence it is more likely that deterioration of the electric characteristic of the capacitor may occur.

In the conventional structure and forming method of capacitor shown in FIG. 33, to form the polysilicon plug (14P in FIG. 33) as a contact for connecting the lower electrodes of the capacitor (16P, 15P in FIG. 33) to the diffusion layer (4P in FIG. 33) of a MOS transistor, an etch-back method by drying etching is employed. In this method, if the etch-back is done uniformly, in order to keep uniformity in the wafer surface, the upper surface of the polysilicon plug sinks about 100 to 200 nm from the upper surface of the interlayer insulating film (10P). If the etch-back is done unequally, the sinking extent is greater. Accordingly, when the lower electrode of the ferrodielectric (or high dielectric) capacitor is formed on the upper surface of the polysilicon plug and the upper surface of the interlayer insulating film formed by this method, the sinking profile of the upper surface of the polysilicon plug is directly reflected to the shape of the lower electrode on the occasion that the barrier layer of the lower electrode (15P in FIG. 33) and the electrode (16P in FIG. 33) are formed, so that the upper surface of the lower electrode corresponding to the upper surface of the polysilicon plug is recessed.

The same problem occurs when forming the plug by a reflow method, instead of the etch-back method.

Incidentally, an edge portion of the lower electrode has a step difference corresponding to the total thickness of the barrier layer (15P) and electrode (16P). Herein, to decrease the local thinning of the dielectric film in this area, it is general to form an oxide film spacer (19P in FIG. 33) in the edge portion of the lower electrode by a self-matching etching method. In this method, however, since the middle of the lower electrode is recessed as mentioned above, the portion of the recess (100 to 200 nm) is buried with an oxide film when forming the oxide film, and at the time of the self-matching etching, it is necessary to arrange so that the oxide film may not be left over in the recess portion. The etching is further carried out in order to meet the requirement, and an upper end of the oxide film spacer formed in the edge portion of the lower electrode sinks from the upper surface of the lower electrode by the portion of the recess, so that the local step difference is still present in the edge portion of the lower electrode in spite of forming the oxide film spacer Considering these points, in the conventional lower electrode forming method, a recess is formed near the middle of the lower electrode, and the dielectric film is locally thin in the area, and a local step difference is also left over in the edge portion of the lower electrode, and hence the capacitor electric film is thinned in the local step difference area of the edge portion, and the electric characteristic of the capacitor deteriorates in these areas, especially in the local step difference position of the edge portion, thereby lowering the reliability of the capacitor. Moreover, in the conventional method, an upper electrode (22P in FIG. 33) is formed on thus formed capacitor dielectric film, and metal wiring layer (24P in FIG. 33) is connected across the interlayer insulating film (23P in FIG. 33), but at this time if there is any step difference on the upper surface of the interlayer insulating film on the capacitor as shown in FIG. 33, it is difficult to form the metal wiring layer by etching. When the capacitor is formed by the conventional method, it is difficult to decrease the step difference of the interlayer insulating film on the capacitor, and difficult in manufacturing process of the metal wiring layer is not improved.

SUMMARY OF THE INVENTION

A first aspect of the invention relates to a semiconductor memory comprising a semiconductor substrate, a transistor formed on and in a principal surface of the semiconductor substrate, the transistor having a diffusion layer formed in the principal surface, a first interlayer insulating film formed smoothly on the principal surface of the semiconductor substrate so as to cover the transistor, a second interlayer insulating film, being an insulating film of a different type from the first interlayer insulating film, consisting essentially of an insulating film of such a material as to be usable as a stopper member of polishing using CMP method, and being formed flatly on an upper surface of the first interlayer insulating film, a contact hole formed in the second and first interlayer insulating films, with a part of an upper surface of the diffusion layer as its bottom surface, a plug formed to fill up a space in the contact hole, and having a flat upper surface in the same height as the height of an upper surface of the second interlayer insulation film from the principal surface of the semiconductor substrate, and a capacitor lower electrode formed on the upper surface of the plug and on the upper surface of the second interlayer insulating film in periphery of the upper surface of the plug.

A second aspect of the invention relates to a semiconductor memory of the first aspect, wherein the second interlayer insulating film is polished to a specified film thickness by the CMP method to be flat, and the upper surface of the plug is also polished by the CMP method to be flat.

A third aspect of the invention relates to a semiconductor memory of the second aspect, wherein the second interlayer insulating film consists essentially of an insulating film having a smaller etching rate than the etching rate of the film for forming the plug.

A fourth aspect of the invention relates to a semiconductor memory of the second aspect, wherein the first interlayer insulating film consists essentially of a film containing a dopant in the second interlayer insulating film.

A fifth aspect of the invention relates to a semiconductor memory of the fourth aspect, wherein the second interlayer insulating film consists essentially of a silicon oxide film, and the first interlayer insulating film consists essentially of the silicon oxide film containing the dopant.

A sixth aspect of the invention relates to a semiconductor memory of the fifth aspect, wherein the second interlayer insulating film consists essentially of a TEOS oxide film, and the first interlayer insulating film consists essentially of a TEOS oxide film containing both a boron and a phosphorus as the dopant.

A seventh aspect of the invention relates to a semiconductor memory of the fifth aspect, wherein the second interlayer insulating film consists essentially of a silicate glass, and the first interlayer insulating film consists essentially of a silicate glass containing both a boron and a phosphorus as the dopants.

An eighth aspect of the invention relates to a semiconductor memory of the first aspect, further comprising an oxide film spacer formed on a part of the upper surface of the second interlayer insulating film and a side surface of the capacitor lower electrode, and a dielectric film formed so as to cover an upper surface of the capacitor lower electrode and an upper surface of the oxide film spacer.

A ninth aspect of the invention relates to a semiconductor memory of the eighth aspect, wherein an other capacitor lower electrode is further formed on the upper surface of the second interlayer insulating film so as to be adjacent to the capacitor lower electrode across a gap, and the oxide film spacer is formed in a built-up form so as to completely fill in the gap, and so as not to sink from each of the upper surfaces of the capacitor lower electrode and the other capacitor lower electrode in each of edge portions of the capacitor lower electrode and the other capacitor lower electrode.

A tenth aspect of the invention relates to a semiconductor memory of the ninth aspect, wherein the oxide film spacer is formed by polishing an oxide film by the CMP method, the oxide film formed on the upper surface of the capacitor lower electrode and the upper surface of the other capacitor lower electrode so as to fill in the gap.

An eleventh aspect of the invention relates to a semiconductor memory of the eighth aspect, wherein the dielectric film consists essentially of a ferrodielectric film or a high dielectric film.

A twelfth aspect of the invention relates to a semiconductor memory of the eighth aspect, further comprising a capacitor upper electrode formed on an upper surface of the dielectric film, a third interlayer insulating film formed on an upper surface of the capacitor upper electrode, and a metal line layer formed on an upper surface of the third layer insulating film.

A thirteenth aspect of the invention relates to a semiconductor memory of the first aspect, wherein the plug is formed on a side wall of the contact hole and the part of upper surface of the diffusion layer, thereby filling in the contact hole.

A fourteenth aspect of the invention relates to a semiconductor memory of the first aspect, further comprising an oxide film spacer formed on the entire surface of a side wall of the contact hole, having a smaller aperture diameter than the diameter of the contact hole, and having an upper surface formed flat in the same height as the height of the upper surface of the second interlayer insulating film from the principal surface of the semiconductor substrate, wherein the plug is formed to fill in the aperture of the oxide film spacer, and the capacitor lower electrode is formed on the upper surface of the plug, on the upper surface of the oxide film spacer, and on the top surface of the second interlayer insulating film.

A fifteenth aspect of the invention relates to a semiconductor memory of the fourteenth aspect, wherein the oxide film spacer consists essentially of a silicon oxide film.

A sixteenth aspect of the invention relates to a semiconductor memory of the fourteenth aspect, further comprising an other capacitor lower electrode further formed on the upper surface of the second interlayer insulating film so as to be adjacent to the capacitor lower electrode through a gap, an other oxide film spacer for filling in the gap completely, being formed flat so as not to sink from each of upper surfaces of the capacitor lower electrode and the other capacitor lower electrode in each of edge portions of the capacitor lower electrode and the other capacitor lower electrode, a dielectric film formed on each of the upper surfaces of the capacitor lower electrode and the other capacitor lower electrode and on the upper surface of the oxide film spacer, a capacitor upper electrode formed on an upper surface of the dielectric film, a third interlayer insulating film formed on an upper surface of the capacitor upper electrode, and a metal line layer formed on an upper surface of the third interlayer insulating film.

A seventeenth aspect of the invention relates to a method of manufacturing a semiconductor memory, the semiconductor memory comprising a transistor and its diffusion layer on and in a principal surface of a semiconductor substrate, the method comprising a first step of forming a first interlayer insulating film flatly on the principal surface of the semiconductor substrate so as to cover the transistor, a second step of forming a second interlayer insulating film on an upper surface of the first interlayer insulating film, the second interlayer insulating film being an insulating film of a different type from the first interlayer insulating film, and consisting essentially of an insulating film of such a material as to be usable as a stopper member of polishing using CMP method, a third step of forming a contact hole of which bottom surface is a part of an upper surface of the diffusion layer, in the second and first interlayer insulating films, a fourth step of forming a plug layer on an upper surface of the second interlayer insulating film so as to fill in a space in the contact hole, a fifth step of polishing the plug layer and the second interlayer insulating film by using the CMP method, until the thickness of the second interlayer insulating film may become a specified residual film thickness to thereby form a plug consisting essentially of the plug layer after polishing in the space in the contact hole, and a sixth step of forming a capacitor lower electrode on an upper surface of the plug and on the upper surface of its surrounding the second interlayer insulating film.

An eighteenth aspect of the invention relates to a method of manufacturing a semiconductor memory of the seventeenth aspect, further comprising a seventh step of forming an oxide spacer on a side surface of the capacitor lower electrode and on a part of the upper surface of the second interlayer insulating film exposed in periphery of the capacitor lower electrode, an eighth step of forming a dielectric film so as to cover each of exposed surfaces of the capacitor lower electrode and the oxide film spacer, and further forming a capacitor upper electrode on an upper surface of the dielectric film, and a ninth step of forming a third interlayer insulating film on an upper surface of the capacitor upper electrode, and further forming a metal line layer on an upper surface of the third interlayer insulating film.

A nineteenth aspect of the invention relates to a method of manufacturing a semiconductor memory of the eighteenth aspect, wherein the sixth step further comprises the steps of forming a capacitor lower electrode film on the upper surface of the plug and the upper surface of the second interlayer insulating film in periphery of the upper surface of the plug, further forming a stopper film on an upper surface of the capacitor lower electrode film, the stopper film consisting essentially of an another material to be used as a stopper member for the CMP method, and etching the capacitor lower electrode film and the stopper film by using a resist formed on an upper surface of the stopper film as a mask, and eliminating the resist later to form the capacitor lower electrode and the stopper layer laminated thereon, and the seventh step further comprises the steps of forming an oxide film so as to cover each of exposed surfaces of the capacitor lower electrode, the upper surface of the second interlayer insulating film, and the stopper film, polishing the oxide film and the stopper film by the CMP method until the film thickness of the stopper film may become a specified residual film thickness, and eliminating only the residual film of the stopper film after the polishing to form the oxide film spacer.

A twentieth aspect of the invention relates to a method of manufacturing a semiconductor memory of the nineteenth aspect, wherein the stopper film consists essentially of a silicon nitride film or a titanium film.

A twenty-first aspect of the invention relates to a method of manufacturing a semiconductor memory of the nineteenth aspect, wherein the third step further comprises a step of forming the contact hole, a step of forming an oxide film for spacer on a side surface and the bottom surface of the contact hole, and on the upper surface of the second interlayer insulating film, and a step of eliminating a portion formed on the upper surface of the second interlayer insulating film of the oxide film for spacer by an anisotropic etching, and of forming an other oxide film spacer on the side surface of the contact hole, the other oxide film having an aperture smaller than the diameter of the contact hole, the fourth step further comprises a step of forming the plug layer on the upper surface of the second interlayer insulating film so as to fill in the aperture made by the other oxide film spacer, the fifth step further comprises a step of polishing the plug layer, the other oxide film spacer and the second interlayer insulating film by the CMP method until the thickness of the second interlayer insulating film becomes the specified residual film thickness, and of forming the plug in the aperture made by the other oxide film spacer, and the sixth step further comprises a step of forming the capacitor lower electrode on each exposed surface of the plug, the other oxide film spacer, and the second interlayer insulating film around the other oxide film spacer.

A twenty-second aspect of the invention relates to a method of manufacturing a semiconductor memory of the eighteenth aspect, wherein the seventh step further comprises the steps of forming an oxide film so as to cover each exposed surface of the capacitor lower electrode and the second interlayer insulating film, and anisotropically etching the oxide film to form the oxide film spacer.

A twenty-third aspect of the invention relates to a method of manufacturing a semiconductor memory of the twenty-second aspect, wherein the third step further comprises a step of forming the contact hole, a step of forming an oxide film for spacer on a side surface and the bottom surface of the contact hole and on the upper surface of the interlayer insulating film, and a step of eliminating a portion formed on the upper surface of the second interlayer insulating film of the oxide film for spacer by an anisotropic etching, and of forming an other oxide film spacer on the side of the contact hole, the other oxide film having an aperture smaller than the diameter of the contact hole, the fourth step further comprises a step of forming the plug layer on the upper surface of the second interlayer insulating film so as to fill in the aperture made by the other oxide film spacer, the fifth step further comprises a step of polishing the plug layer, the other oxide film spacer and the second interlayer insulating film by the CMP method until the thickness of the second interlayer insulating film becomes the specified residual film thickness, and of forming the plug in the aperture made by the other oxide film spacer, and the sixth step further comprises a step of forming the capacitor lower electrode on each exposed surface of the plug, the other oxide film spacer, and the second interlayer insulating film around the other oxide film spacer.

A twenty-fourth aspect of the invention relates to a stacked capacitor for a semiconductor memory connected to a diffusion layer of a transistor formed on a principal surface of a semiconductor substrate, the stacked capacitor comprising an interlayer insulating film formed smoothly on the principal surface of the semiconductor substrate so as to cover the transistor, a contact hole formed in the interlayer insulating film, with a part of an upper surface of the diffusion layer as its bottom surface, a plug formed so as to fill in the space in the contact hole, the plug having a flat upper surface in the same height as the height of an upper surface of the interlayer insulating film from the principal surface of the semiconductor substrate, a capacitor lower electrode formed on the upper surface of the plug and on the upper surface of the interlayer insulating film around the upper surface of the plug, a dielectric film formed on an upper surface of the capacitor lower electrode, and a capacitor upper electrode formed on an upper surface of the dielectric film, wherein the interlayer insulating film comprises at least two different type insulating films, and an outermost insulating film of the two different type insulating films has an etching rate smaller than the etching rate of a film for forming the plug, and a lowest insulating film of the two different type insulating films has an etching rate greater than the etching rate of the film for forming the plug, and the dielectric film consists essentially of a ferrodielectric film or a high dielectric film.

A twenty-fifth aspect of the invention relates to a stacked capacitor of the twenty-fourth aspect, wherein the lowest insulating film for forming the interlayer insulating film is a silicon oxide film having both boron and phosphorus as dopants, and the outermost insulating film for forming the interlayer insulating film is an another silicon oxide film not having the dopants.

A twenty-sixth aspect of the invention relates to a stacked capacitor of the twenty-fourth aspect, further comprising an oxide film spacer formed smoothly on a side surface of the capacitor lower electrode and on an upper surface of the interlayer insulating film around the side surface of the capacitor lower electrode, so that the upper surface of the capacitor lower electrode may not sink from a position of the upper surface in an edge portion of the capacitor lower electrode, wherein the dielectric film is formed on the upper surface of the capacitor lower electrode and on an upper surface of the oxide film spacer.

A twenty-seventh aspect of the invention relates to a stacked capacitor of the twenty-fourth aspect, further comprising an oxide film spacer formed on an entire surface of a side wall of the contact hole, the oxide film spacer having a smaller aperture than a diameter of the contact hole, and having an upper surface formed smoothly in the same height as a height of an upper surface of the interlayer insulating film from the principal surface of the semiconductor substrate, wherein the plug is formed so as to fill in the aperture of the oxide film spacer, and the capacitor lower electrode is formed on the upper surface of the plug, on the upper surface of the oxide film spacer, and on the upper surface of the interlayer insulating film.

A twenty-eighth aspect of the invention relates to a stacked capacitor of the twenty-seventh aspect, further comprising an other oxide film spacer formed smoothly on a side surface of the capacitor lower electrode and on the upper surface of the interlayer insulating film around the side surface of the capacitor lower electrode, so that the upper surface of the capacitor lower electrode may not sink from a position of the upper surface in an edge portion of the capacitor lower electrode, wherein the dielectric film is formed on the upper surface of the capacitor lower electrode and on the upper surface of the other oxide film spacer.

A twenty-ninth aspect of the invention relates to a stacked capacitor for a semiconductor memory, formed above an upper surface of an interlayer insulating film formed on a principal surface of a semiconductor substrate, comprising a capacitor lower electrode formed on the upper surface of the interlayer insulating film, an oxide film spacer formed smoothly on a side surface of the capacitor lower electrode and on the upper surface of the interlayer insulating film in periphery of the side surface of the capacitor lower electrode, of which a height from the upper surface of the interlayer insulating film of an edge portion of an upper surface is higher than that of an upper surface of the capacitor lower electrode, a dielectric film formed on the upper surface of the capacitor lower electrode, on the upper surface of the oxide film spacer, and on a side surface of the oxide film spacer projecting from the upper surface of the interlayer insulating film, and a capacitor upper electrode formed on an upper surface of the dielectric film, wherein the dielectric film consists essentially of a ferrodielectric film or a high dielectric film.

A thirtieth aspect of the invention relates to a stacked capacitor of the twenty-ninth aspect, wherein the oxide film spacer is formed by polishing and smoothing an oxide film formed to cover both a stopper film formed preliminarily on the upper surface of the capacitor lower electrode and the upper surface of the interlayer insulating film until the stopper film may be a specified residual thickness of film by a CMP method, and by eliminating the residual film of the stopper film.

In the semiconductor memory of the first aspect, the upper surface of the plug for filling in the space in the contact hole is flat, and the height of the upper surface of the plug from the principal surface of the semiconductor substrate is same as the height of the upper surface of the second interlayer insulating film from the principal surface of the semiconductor substrate, and therefore the capacitor lower electrode formed on the upper surface of the plug and on the upper surface of the second interlayer insulating film around the upper surface of the plug is also a flat electrode without recess.

In the semiconductor memory of the second aspect, the second interlayer insulating film function as a stopper member when polishing by the CMP method to be formed in a specified film thickness, and as a result the height of the upper surface of the plug polished by the CMP method simultaneously coincides with the height of the second interlayer insulating film, and the upper surface of the plug is flattened.

In the semiconductor memory of the third aspect, the second interlayer insulating film function as the stopper member when polishing by using the CMP method.

In the semiconductor memory of the fourth aspect, the second interlayer insulating film function as the stopper member when polishing by using the CMP method.

In the semiconductor memory of the fifth aspect, the second interlayer insulating film function as the stopper member when polishing by using the CMP method.

In the semiconductor memory of the sixth aspect, the second interlayer insulating film function as the stopper member when polishing by using the CMP method.

In the semiconductor memory of the seventh aspect, the second interlayer insulating film function as the stopper member when polishing by using the CMP method.

In the semiconductor memory of the eighth aspect, the capacitor lower electrode is a flat film without recess, and hence the portion of the dielectric film formed thereon is a film without recess, and has a uniform film thickness. Accordingly, the influence conventionally derived from formation of recess in the portion of the dielectric film being above the capacitor lower electrode does not cause on the shape of the oxide film spacer.

In the semiconductor memory of the ninth aspect, the oxide film spacer formed in the gap has a shape raised higher than the upper surface of the capacitor lower electrode, and hence any local step difference is not caused in the edge portion of the capacitor lower electrode.

In the semiconductor memory of the tenth aspect, the oxide film spacer is polished by using the CMP method, and hence any local step difference is not caused in the edge portion of the capacitor lower electrode.

In the semiconductor memory of the eleventh aspect, the dielectric film functions as a ferrodielectric or high dielectric.

In the semiconductor memory of the twelfth aspect, the capacitor lower electrode is a film without recess, and hence the dielectric film, capacitor upper electrode and third interlayer insulating film formed sequentially thereon are also free from recess in the portion being above the capacitor lower electrode. Therefore, the metal wiring layer is formed on the upper surface of the recess-free third interlayer insulating film.

In the semiconductor memory of the thirteenth aspect, the plug fills in the contact hole completely.

In the semiconductor memory of the fourteenth aspect, the oxide film spacer reduces the diameter of the contact hole. As a result, the diameter of the upper surface of the plug is also reduced.

In the semiconductor memory of the fifteenth aspect, the silicon oxide film functions as the oxide film spacer.

In the semiconductor memory of the sixteenth aspect, the other oxide film spacer formed in the gap does not have the shape sinking from the upper surface of the capacitor lower electrode, and hence any local step difference is not formed in the edge portion of the capacitor lower electrode. Accordingly, the dielectric film, capacitor upper electrode, and third interlayer insulating film are films completely free from recess, and the metal wiring layer is formed on the entire upper surface of the recess-completely-free third interlayer insulating film.

In the semiconductor memory of the seventeenth aspect, by the fifth step, the upper surface of the plug is formed on a flat surface having a same height as the height of the upper surface of the second interlayer insulating film from the principal surface of the semiconductor substrate. Therefore, by the sixth step, the capacitor lower electrode is formed as a flat electrode free from recess.

In the manufacturing method of semiconductor memory of the eighteenth aspect, since the capacitor lower electrode formed by the sixth step is a flat electrode free from recess, the oxide film spacer formed on its side surface is free from the influence occured in the prior art in which the capacitor lower electrode had a recess. The dielectric film and the capacitor upper electrode formed in the eighth step are both free from recess in the portion being above the capacitor lower electrode. Similarly, the third interlayer insulating film formed in the ninth step is also free from recess in the portion being above the capacitor lower electrode. Therefore, the metal wiring layer may be easily formed on the portion of the third interlayer insulating film free from recess.

In the manufacturing method of semiconductor memory of the nineteenth aspect, since polishing is done by the CMP method using the stopper film, the capacitor lower electrode will not be damaged by this polishing. Moreover, after polishing, since the stopper film is eliminated, the oxide film spacer formed after the elimination is in a shape raised higher than the upper surface of the capacitor lower electrode. Hence, any local step difference is not formed in the edge portion of the capacitor lower electrode.

In the manufacturing method of semiconductor memory of the twentieth aspect, the silicon nitride film or titanium film function as the stopper film when polishing by the CMP method.

In the manufacturing method of semiconductor memory of the twenty-first aspect, the other oxide film spacer reduces the diameter of the contact hole. As a result, the diameter of the upper surface of the plug is also reduced.

In the manufacturing method of semiconductor memory of the twenty-second aspect, the oxide film spacer formed on the side surface of the capacitor lower electrode by the anisotropic etching slightly sinks from the upper surface of the capacitor lower electrode.

In the manufacturing method of semiconductor memory of the twenty-third aspect, the other oxide film spacer reduces the diameter of the contact hole. As a result, the diameter of the upper surface of the plug is also reduced.

In the stacked capacitor for semiconductor memory of the twenty-fourth aspect, the upper surface of the plug for filling in the space in the contact hole is flat, and the height of the upper surface of the plug from the principal surface of the semiconductor substrate is same as that of the upper surface of the insulating film of the outermost side for composing the interlayer insulating film, and therefore the capacitor lower electrode formed on the upper surface of the plug and on the upper surface of the insulating layer of the outermost side in the periphery is also a flat electrode free from recess.

In the stacked capacitor for semiconductor memory of the twenty-fifth aspect, the silicon oxide film having the boron and phosphoras as dopants corresponds to the insulating film of the outermost side, and the silicon oxide film not having any dopant corresponds to the insulating film of the lowest position for composing the interlayer insulating film.

In the stacked capacitor for semiconductor memory of the twenty-sixth aspect, the oxide film spacer does not have the shape sinking from the upper surface of the capacitor lower electrode, any local step difference is not formed in the edge portion of the capacitor lower electrode. Accordingly, the dielectric film and capacitor upper electrode are films completely free from recess.

In the stacked capacitor for semiconductor memory of the twenty-seventh aspect, the oxide film spacer reduces the diameter of the contact hole, and as a result, the diameter of the upper surface of the plug is also reduced.

In the stacked capacitor for semiconductor memory of the twenty-eighth aspect, the other oxide film spacer does not have the shape sinking from the upper surface of the capacitor lower electrode, any local step difference is not formed in the edge portion of the capacitor lower electrode. Accordingly, the dielectric film and capacitor upper electrode are films completely free from recess.

In the stacked capacitor for semiconductor memory of the twenty-ninth aspect, the oxide film spacer does not have the shape sinking from the upper surface of the capacitor lower electrode, any local step difference is not formed in the edge portion of the capacitor lower electrode. Accordingly, the dielectric film and capacitor upper electrode are films completely free from recess.

In the stacked capacitor for semiconductor memory of the thirtieth aspect, the stopper film functions as the stopper member of the CMP method, and also prevents damage of the upper surface of the capacitor lower electrode.

According to the first aspect of the invention, the capacitor lower electrode is formed as an electrode of uniform film thickness free from recess, and hence the local step difference in the capacitor lower electrode can be decreased. As a result, the leak current caused by the local step difference can be reduced, thereby contributing to enhancement of the electric characteristic of the capacitor.

According to the second aspect of the invention, by utilizing polishing by the CMP method, the capacitor lower electrode can be formed as an electrode of uniform film thickness free from recess.

According to the third aspect of the invention, by utilizing polishing by the CMP method, the capacitor lower electrode can be formed as an electrode of uniform film thickness free from recess.

According to the fourth aspect of the invention, by utilizing polishing by the CMP method, the capacitor lower electrode can be formed as an electrode of uniform film thickness free from recess.

According to the fifth aspect of the invention, by utilizing polishing by the CMP method, the capacitor lower electrode can be formed as an electrode of uniform film thickness free from recess.

According to the sixth aspect of the invention, by utilizing polishing by the CMP method, the capacitor lower electrode can be formed as an electrode of uniform film thickness free from recess.

According to the seventh aspect of the invention, by utilizing polishing by the CMP method, the capacitor lower electrode can be formed as an electrode of uniform film thickness free from recess.

According to the eighth aspect of the invention, since the oxide film spacer is formed on the side surface of the capacitor lower electrode of uniform film thickness free from recess, the local step difference in the capacitor lower electrode can be further decreased as compared with the prior art, so that the electric characteristic of the capacitor can be enhanced by the corresponding portion.

According to the ninth aspect of the invention, the capacitor lower electrode of uniform film thickness free from recess can be formed, and generation of the local step difference in the edge portion of the capacitor lower electrode can be completely prevented by forming the oxide film spacer, and hence the leak current is substantially decreased and the electric characteristic of the capacitor may be enhanced outstandingly.

According to the tenth aspect of the invention, by utilizing polishing by the CMP method, the oxide film spacer can be formed.

According to the eleventh aspect of the invention, the ferrodielectric capacitor or high dielectric capacitor small in leak current can be realized. According to the twelfth aspect of the invention, since the local step difference caused in the capacitor lower electrode can be decreased, processing and formation of the metal wiring layer may be facilitated outstandingly.

According to the thirteenth aspect of the invention, the recess-free plug can be realized easily.

According to the fourteenth aspect of the invention, the transfer overlap margin between the plug linked to the diffusion layer and the capacitor lower electrode can be increased.

According to the fifteenth aspect of the invention, the oxide film spacer can be realized by the silicon oxide film for general purpose.

According to the sixteenth aspect of the invention, the local step difference in the capacitor lower electrode is outstandingly decreased so that the leak current can be decreased sufficiently, and processing and formation of the metal wiring layer may be facilitated outstandingly.

According to the seventeenth aspect of the invention, the capacitor lower electrode can be formed into an electrode of uniform film thickness free from recess, so that the local step difference in the capacitor lower electrode can be decreased. As a result, the leak current caused by the local step difference can be decreased, thereby contributing to the electric characteristic of the capacitor.

According to the eighteenth aspect of the invention, the metal wiring layer can be formed easily.

According to the nineteenth aspect of the invention, damage of the capacitor lower electrode is prevented completely when polishing the oxide film by using the CMP method, and the oxide film spacer capable of completely preventing formation of the local step difference can be formed. As a result, the capacitor of high performance sufficiently decreased in the leak current, being free from deterioration of the characteristic of the capacitor lower electrode can be realized.

According to the twentieth aspect of the invention, a general film such as the silicon nitride film and titanium film can be used as the stopper member for polishing by the CMP method.

According to the twenty-first aspect of the invention, the transfer overlap margin between the plug linked to the diffusion layer and the capacitor lower electrode can be increased, so that the manufacture may be easier.

According to the twenty-second aspect of the invention, the oxide film spacer less in formation of the local step difference can be formed on the side surface of the capacitor lower electrode.

According to the twenty-third aspect of the invention, the transfer overlap margin between the plug and the capacitor lower electrode can be increased, so that an easier manufacturing method may be presented.

According to the twenty-fourth aspect of the invention, the capacitor lower electrode can be formed in an electrode of uniform film thickness free from recess, and hence the local step difference in the capacitor lower electrode can be decreased. As a result, the leak current caused by the local step difference can be decreased, so that the stacked capacitor excellent in the electric characteristic can be realized.

According to the twenty-fifth aspect of the invention, the interlayer insulating film can be realized on the basis of the silicon oxide film for general purpose.

According to the twenty-sixth aspect of the invention, formation of the local step difference in the edge portion of the capacitor lower electrode can be completely prevented by forming the oxide film spacer. As a result, the stacked capacitor capable of substantially decreasing the leak current can be realized.

According to the twenty-seventh aspect of the invention, when manufacturing the stacked capacitor, it is effective to increase the transfer overlap margin between the plug and the capacitor lower electrode.

According to the twenty-eighth aspect of the invention, formation of the local step difference in the edge portion of the capacitor lower electrode can be prevented completely by forming the oxide film spacer. As a result, a stacked capacitor capable of substantially decreasing the leak current is realized.

According to the twenty-ninth aspect of the invention, formation of local step difference in the edge portion of the capacitor lower electrode can be prevented completely, and the stacked capacitor capable of substantially decreasing the leak current can be presented.

According to the thirtieth aspect of the invention, it is effective to utilize polishing by the CMP method, without deteriorating the characteristic of the capacitor lower electrode, when manufacturing the stacked capacitor.

Being intended to overcome the problems, it is therefore a first object of the present invention to realize a stacked capacitor in a structure not forming any recess in the lower electrode and a semiconductor memory device having the same, and its manufacturing method.

It is a second object, in addition to the structure of the first object, to realize a stacked capacitor in a structure not forming any local step difference in the edge portion of the capacitor lower electrode and a semiconductor memory device having the same, and its manufacturing method.

It is a third object to present a semiconductor memory having a structure easy in a transfer process of a lower electrode and a capacitor contact, in forming the capacitor lower electrode free from any recess, and its manufacturing method.

It is a fourth object to process and form easily a metal wiring layer to be formed above the stacked capacitor.

It is a fifth object to realize an oxide film spacer capable of completely preventing generation of local step difference in the edge portion of the capacitor lower electrode on a side surface of the capacitor lower electrode.

It is a sixth object to apply a favorable polishing and processing method using a CMP method in manufacture of the stacked capacitor.

These and other objects, features, aspects and advantages of the present invention will become more apparent from the following description of the present invention when taken in conjunction with the accompanying drawings.

DESCRIPTION OF THE PREFERRED EMBODIMENTS (Embodiment 1)

A first preferred embodiment of the invention is described below as an example of application in a DRAM.

Figure 8:
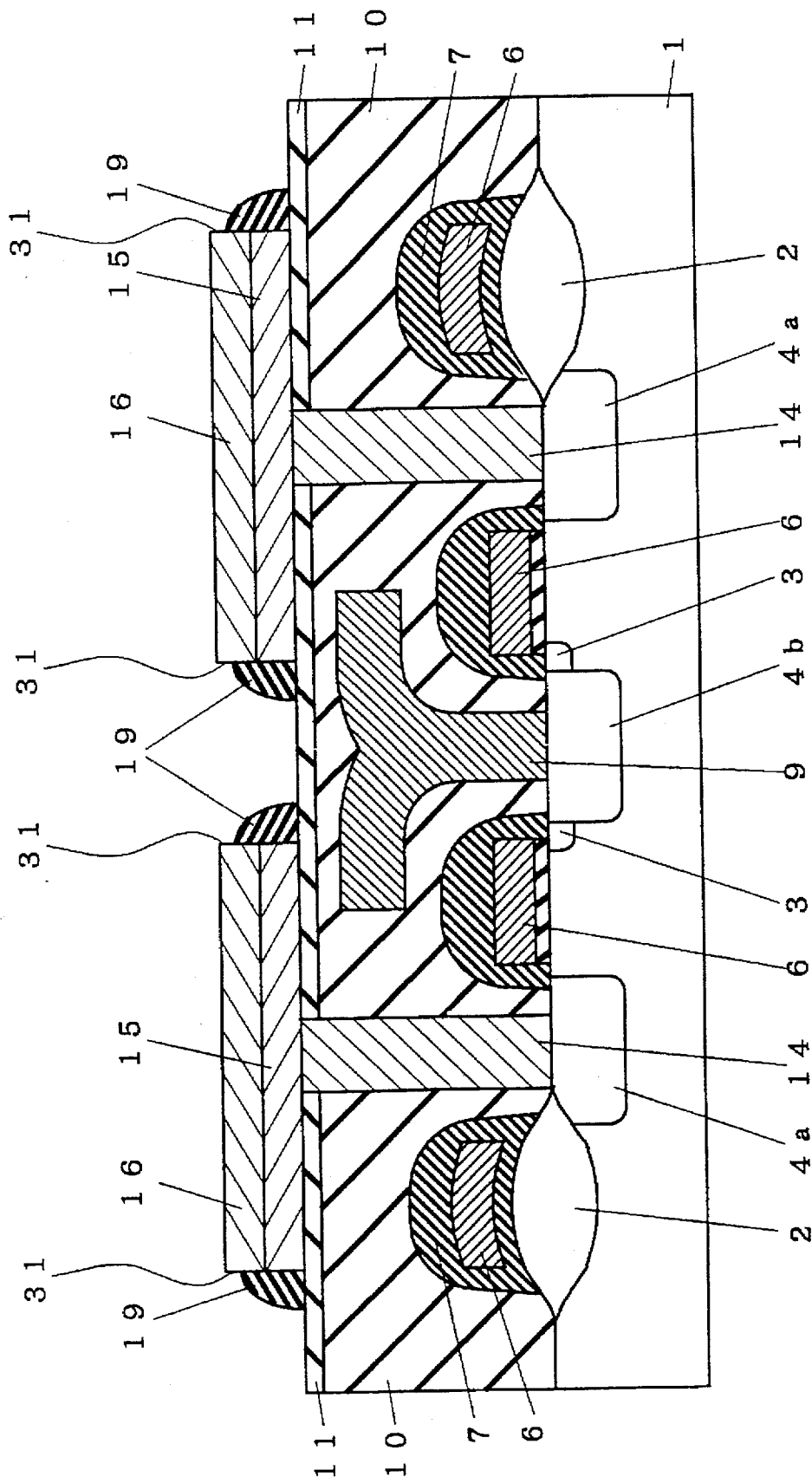
FIG. 8 is a sectional view of the semiconductor memory device in the first preferred embodiment of the invention.
Figure 9:
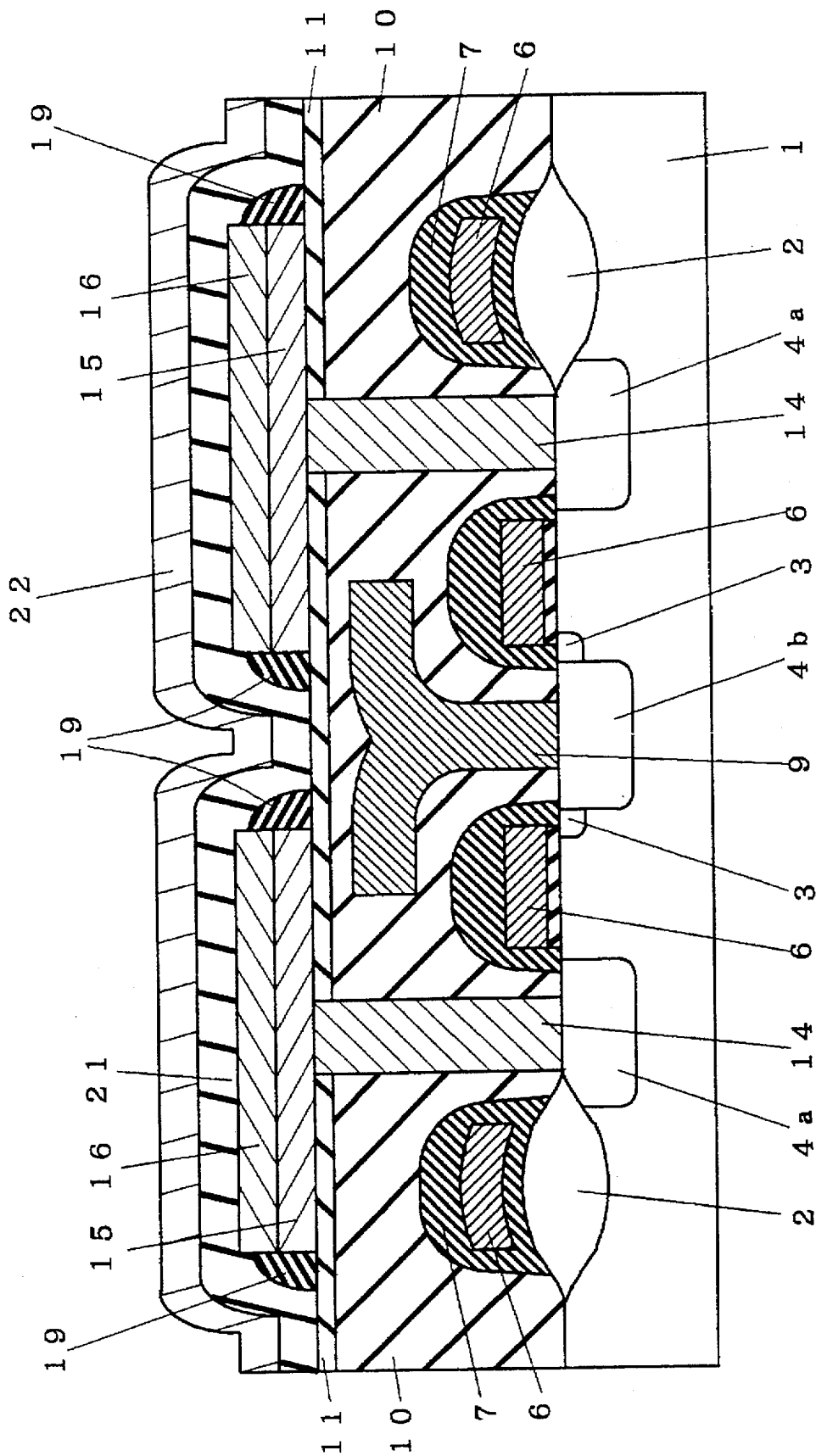
FIG. 9 is a sectional view of the semiconductor memory device in the first preferred embodiment of the invention.
Figure 10:
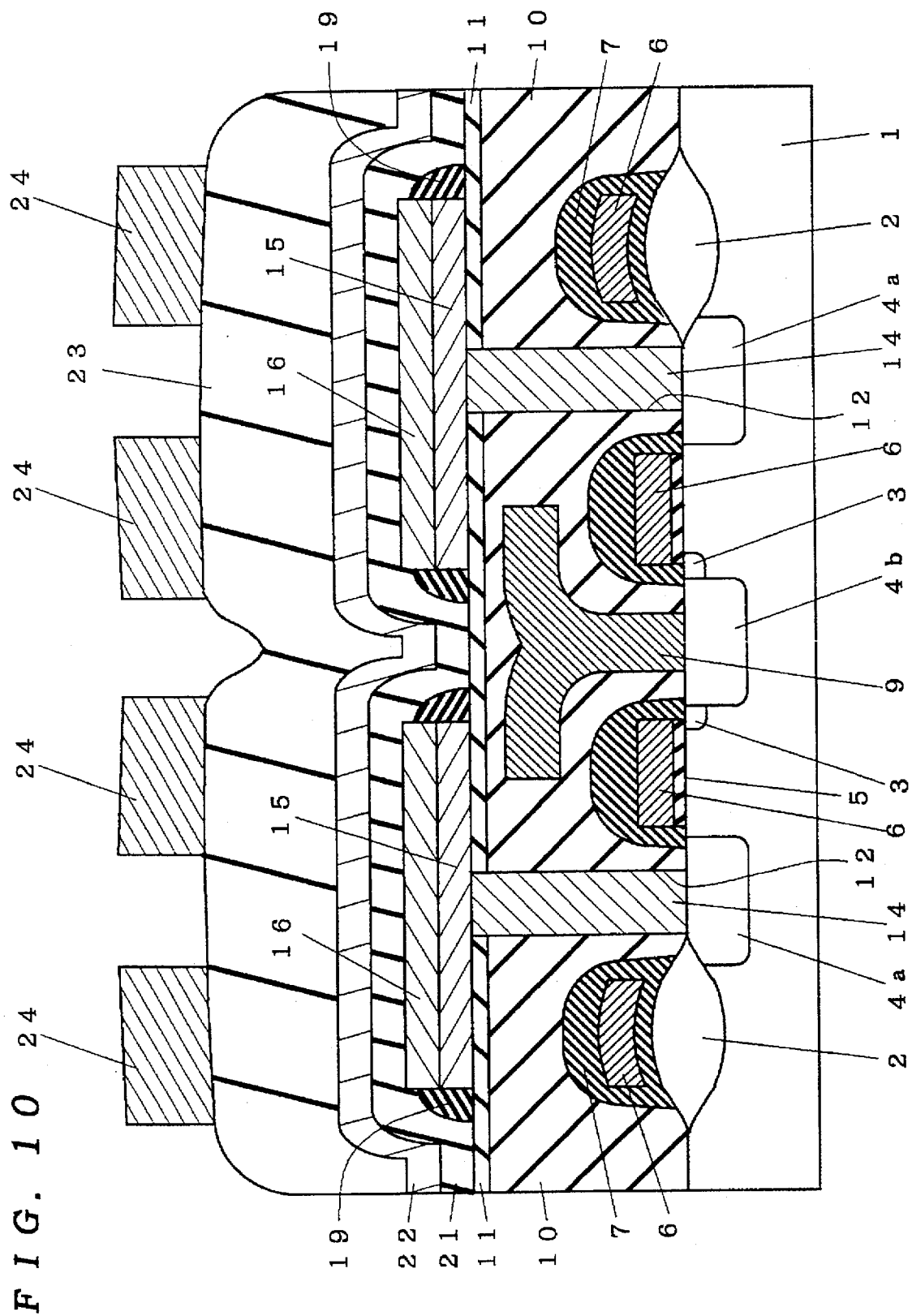
FIG. 10 is a sectional view of the semiconductor memory device in the first preferred embodiment of the invention.

FIG. 1 to FIG. 10 are sectional views of structure of a semiconductor memory device for describing the first preferred embodiment. Among them, FIG. 10 shows the structure after completion of the manufacture, whereas FIG. 1 to FIG. 9 show the structure in the process of manufacture.

What differs between the semiconductor memory device or a stacked capacitor (hereinafter called capacitor) in the preferred embodiment and the semiconductor memory device or the capacitor of the prior art shown in FIG. 33 lies in that, as shown in FIG. 10, (1) an interlayer insulating film for covering a MOS transistor and for forming a contact hole 12 is formed as two different films 10 (the film 10 corresponds to a lowest insulating film) and 11 (the film 11 corresponds to an outermost insulating film), and that (2) a polysilicon plug 14 (plug) is polished and formed by using a CMP (chemical mechanical polishing) method. Accordingly, in this embodiment 1, it is improved not to sink the shape as compared with the prior art in which the upper surface of the polysilicon plug dropped.

That is, in the embodiment 1, since the polysilicon plug 14 is formed by the CMP method, when the interlayer insulating film is exposed, the CMP polishing of the polysilicon film must be stopped. Hence, in this embodiment 1, the interlayer insulating film is composed of two or more layers, and the outermost insulating film (corresponding to a second interlayer insulating film) 11 is composed of an insulating film usable as a stopper member of the CMP polishing, being formed of, for example, a non-doped TEOS oxide film, a non-doped silicate glass (SG), or an other silicon oxide film, whereas the lower interlayer insulating film (corresponding to a first interlayer insulating film) 10 below it is composed of a material capable of smoothing the interlayer film shape beneath the capacitor, being formed of, for example, a TEOS oxide film having boron (B) and phosphorus (P) (that is, a BPTEOS oxide film), a SG having B and P, and an other reflow glass or similar material (corresponding to a silicon oxide film having dopants).

In the first preferred embodiment, as a more preferable example, a TEOS oxide film doped with boron (B) at concentration of 1 to 3 wt. % and phosphorus (P) at concentration of 6 to 8 mol % is used as the first interlayer insulating film 10, and a TEOS oxide film without dopants with a film thickness of 200 nm or less is used as the second interlayer insulating film in the outermost surface. The reason of selecting such materials lies in the selection ratio of the CMP polishing and the interlayer insulating film.

That is, in the first place, it is necessary to make the interlayer insulating film on a bit line (9 in FIG. 10) flat, but it cannot be realized with a non-doped silicon oxide film, and hence a silicon oxide film having dopants for realizing it, or a BPTEOS oxide film in this example, is used. However, when using the BPTEOS oxide film as the stopper layer of the CMP method, since the BPTEOS oxide film is a sorer material than the polysilicon film to be used as the plug layer, the BPTEOS oxide film is polished and eliminated earlier than the polysilicon film by the CMP method, and hence the polysilicon plug is projected. Accordingly, the present applicant has employed a dopant-free TEOS oxide film, which is a stiffer material, instead of the BPTEOS oxide film, as the stopper layer or stopper member of the CMP method. In this case, as shown in Table 1, the etching rate of the TEOS oxide film is about ½ larger than that of the polysilicon film, and therefore by using the non-doped TEOS oxide film as a preferred material for the stopper layer, the object of the embodiment 1 can be achieved sufficiently.

TABLE 1

| Material | Etching rate (e.r.) |
| --- | --- |
| Polysilicon film | 1 |
| TEOS oxide film | 0.5 |
| BPTEOS oxide film | 2 |

In succession, the manufacturing process of the semiconductor memory device or the stacked capacitor shown in FIG. 10 is described while referring to FIG. 1 to FIG. 10.

Figure 1:
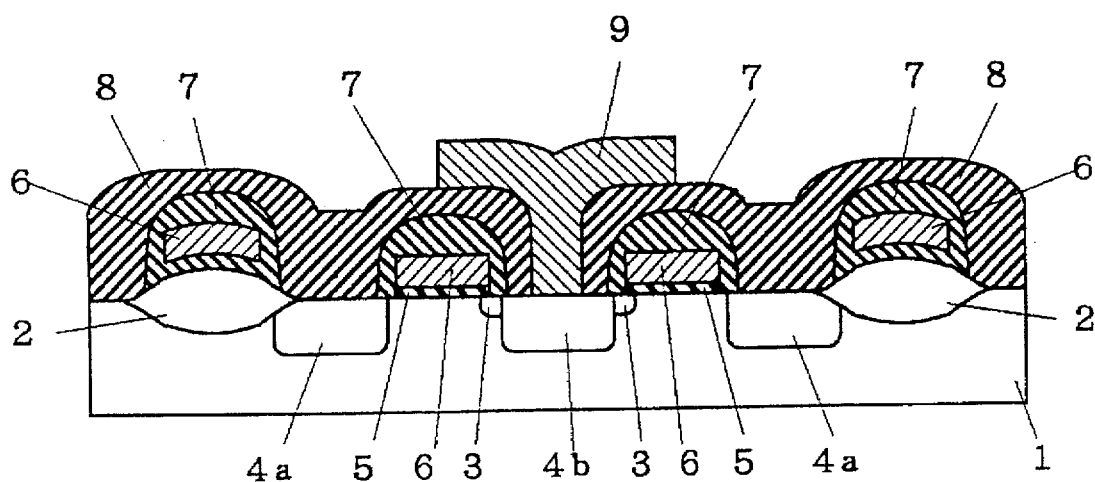
FIG. 1 is a sectional view of a semiconductor memory device in a first preferred embodiment of the invention.

First, as shown in FIG. 1, a bit line layer 9 is processed and formed on an exposed surface of an impurity region 4b (also called a diffusion layer) which is one drain/source region of a transistor. In this state, the device structure is not flattened yet.

In the diagram, reference numeral 1 denotes a semiconductor substrate composed of a silicon substrate or the like, 2 denotes a field oxide film, 3 denotes an impurity region, 4a, 4b denote impurity regions (diffusion layers) formed on a principal surface of the semiconductor layer 1, 5 denotes a gate oxide film of a transistor, 6 denotes a gate layer of the transistor, 7 denotes an insulating film, 8 denotes an interlayer insulating film, and 9 denotes a bit line layer.

Figure 2:
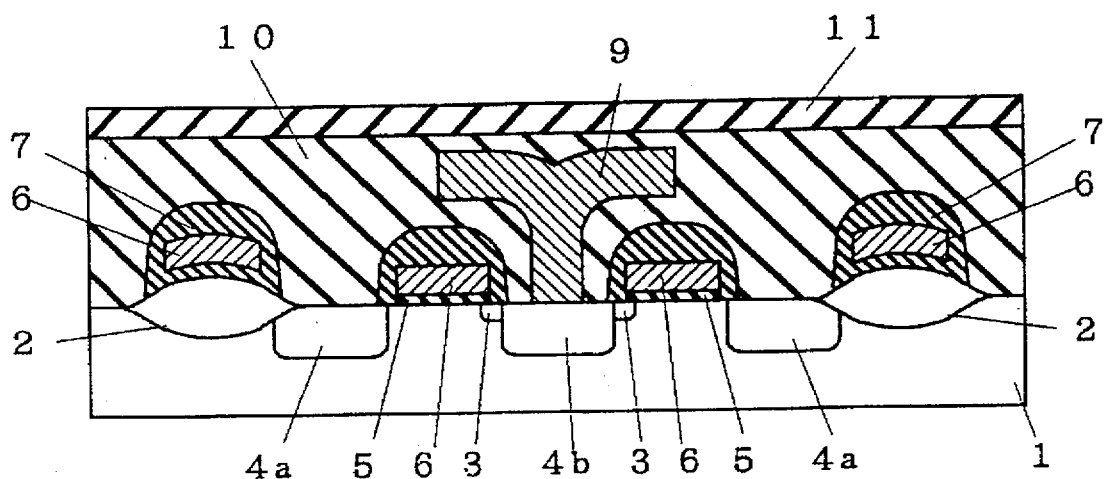
FIG. 2 is a sectional view of the semiconductor memory device in the first preferred embodiment of the invention.

Next, using a silicon oxide film having reflowable dopants such as a BPTEOS oxide film, by sequentially performing reflow by heat treatment and etch-back process, a first interlayer insulating film 10 of which upper surface is completely smoothed is formed above both an upper surface of the bet line layer 9 of the transistor and the principal surface of semiconductor substrate 1 so as to cover them. On an upper surface of the first interlayer insulating film 10, a second interlayer insulating film 11 functioning as a polishing stopper, such as a TEOS oxide film, is formed in a thickness of about 200 nm (FIG. 2).

Herein, it is because of the following reason that the thickness of the second interlayer insulating film 11 is defined about 200 nm. That is, the thickness of the second interlayer insulating film after polishing by the CMP method must be thick enough so that cracks may not be generated by heat treatment in after-treatment, and 30 to 100 nm is required, and therefore if the second interlayer insulating film 11 in its initial state is formed thicker than 200 nm, the etching amount in polishing by the CMP method increases, fluctuation of uniformity are likely to occur, and it is intended to avoid this.

Figure 3:
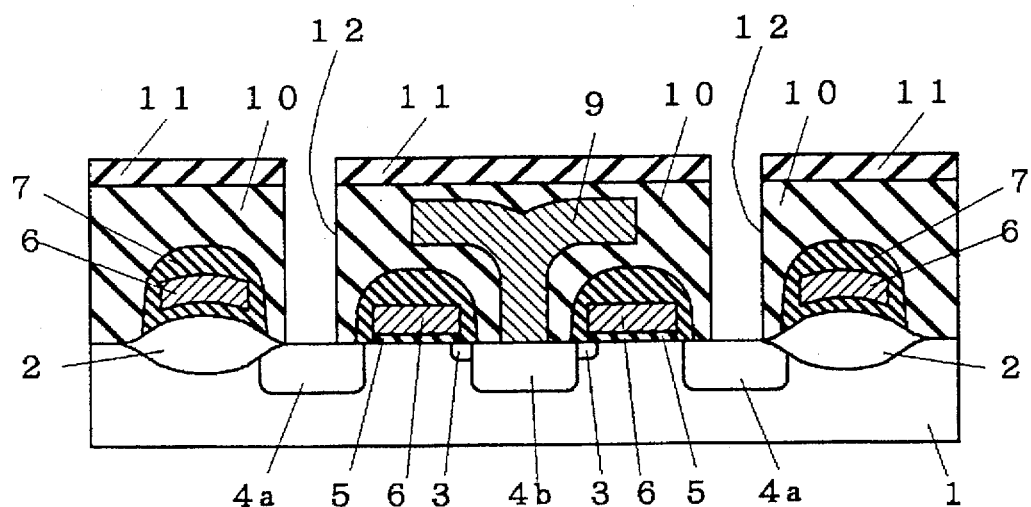
FIG. 3 is a sectional view of the semiconductor memory device in the first preferred embodiment of the invention.

In consequence, using a resist mask not shown, a capacitor contact hole 12 of which bottom surface is an upper surface of the impurity region 4a is processed and formed in the first and second interlayer insulating films 10, 11 (FIG. 3). Then the resist mask is eliminated.

Figure 4:
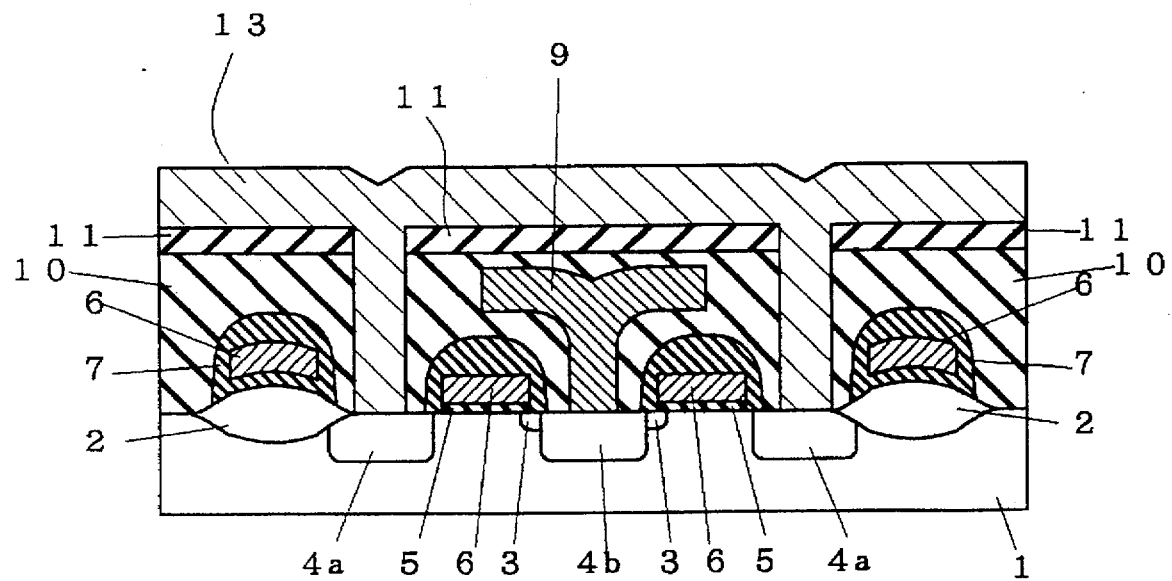
FIG. 4 is a sectional view of the semiconductor memory device in the first preferred embodiment of the invention.

Furthermore, to fill in the space in the capacitor contact hole 12 completely, a polysilicon film 13 (plug layer) is formed on an upper surface of the second interlayer insulating film 11 (FIG. 4).

Figure 5:
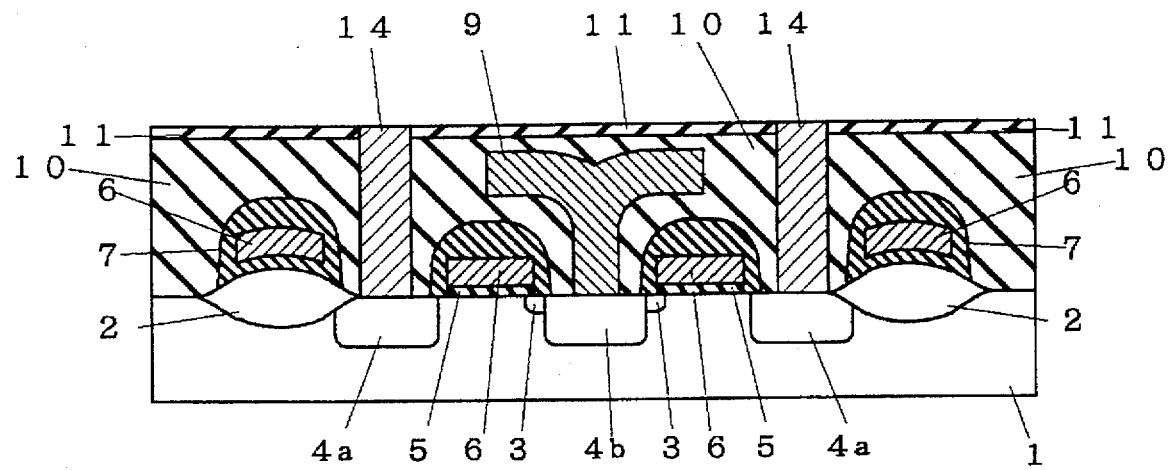
FIG. 5 is a sectional view of the semiconductor memory device in the first preferred embodiment of the invention.

Next, using the CMP method, the polysilicon film 13 is polished to be flat so as not to cause any local step difference such as sinking of an upper portion of the plug, and the outermost second interlayer insulating film 11 is formed in a specified residual film thickness, that is, a residual film thickness of about 30 to 100 nm, thereby forming a polysilicon plug 14 (FIG. 5). As a result, an upper surface of the polysilicon plug 14 is flattened, and the height of the upper surface from the principal surface of the semiconductor substrate 1 is equal to the corresponding height of the second interlayer insulating film 11.

Figure 6:
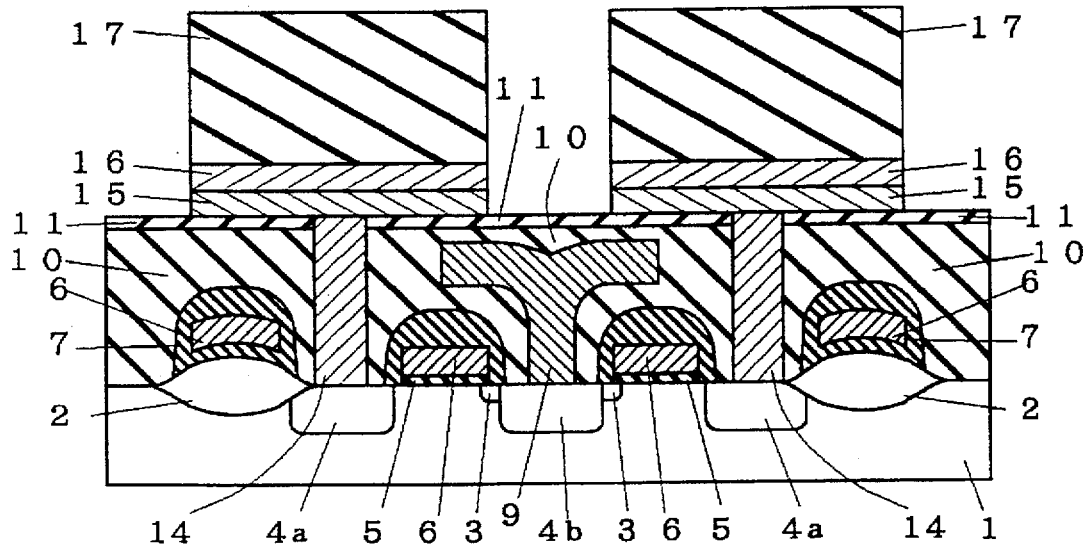
FIG. 6 is a sectional view of the semiconductor memory device in the first preferred embodiment of the invention.

Sequentially, on the upper surface of the polysilicon plug 14 and on the upper surface of the second interlayer insulating film 11 in its periphery, a barrier layer 15 as a diffusion suppressing layer, and a lower electrode 16 are formed successively and the capacitor lower electrodes (15, 16) are processed and formed using a resist 17 as mask (FIG. 6). Herein, the capacitor lower electrode refers to both the barrier layer 15 and the lower electrode 16 inclusively. As the material of the barrier layer, a Ti derivative laminate film such as TiN/Ti is used. As the material of the lower electrode 16, since it is necessary to form a base layer enabling crystal growth of a thin film of ferrodielectric (or high dielectric), it is necessary to use a metal film such as Pt, Pd, Rh, Ni, and W, an alloy film of Pt, Pd, Rh, Ni and W, and metal laminate films such as Ru/RuO2 and Ir/IrO2.

Figure 7:
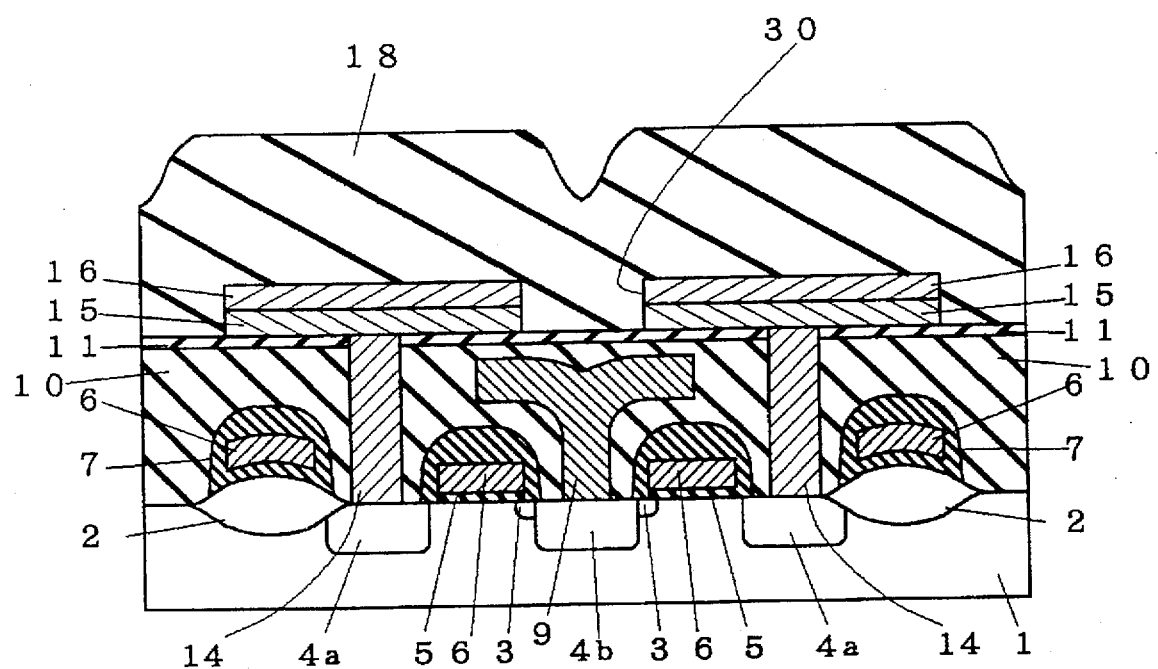
FIG. 7 is a sectional view of the semiconductor memory device in the first preferred embodiment of the invention.

Then, after eliminating the resist 17, an oxide film for forming an oxide film spacer on a side surface 30 of the capacitor lower electrodes (15, 16), or a silicon oxide film 18 in this case is formed on an upper surface and the side surface 30 of the capacitor lower electrodes (15, 16), and on the upper surface of the exposed second interlayer insulating film 11 in the periphery of the capacitor lower electrodes, and thereby gaps between the capacitor lower electrodes (15, 16) and the adjacent capacitor lower electrode (corresponding to an other capacitor lower electrode) are filled with the silicon oxide film 18 (FIG. 7).

Next, by etching the silicon oxide film 18 so as not to cause any local step difference in an edge portion 31 of the lower electrode 16 by an anisotropic dry etching, an oxide film spacer 19 is framed to the side surface 30 (see FIG. 7) of the capacitor lower electrode (FIG. 8). At this time, in this embodiment 1, since any recess is not formed in the middle of the capacitor lower electrodes (15, 16), it is not necessary to do an etching to eliminate the residue of the recess as required in the prior art. For the corresponding portion, accordingly, the local step difference in the edge portion 31 of the capacitor lower electrode is smaller in this embodiment1 as compared with the prior at (see FIG. 33).

Afterwards, by forming a ferrodielectric (or high dielectric) film 21 by a sputtering method or a MOCVD method, a capacitor upper electrode 22 (called merely an upper electrode 22 hereinafter) is formed thereon (FIG. 9). Herein, as the high dielectric film, (Ba, Sr)TiO3, BaTiO3, SrTiO3, and the like may be used, and as the ferrodielectric film, oxide ceramics such as PbTiO3, PbZrO3, LiNbO3, PZT, PLZT, and others may be used. Incidentally, the ferrodielectric film or high dielectric film is merely called also as a dielectric film collectively. A material for the upper electrode 22 may be same as used in the lower electrode 16.

After forming a third interlayer insulating film 23 on an upper surface of the upper electrode 22, a metal line material is formed into a film and processed, so that a metal line layer 24 is formed (FIG. 10).

Figure 33:
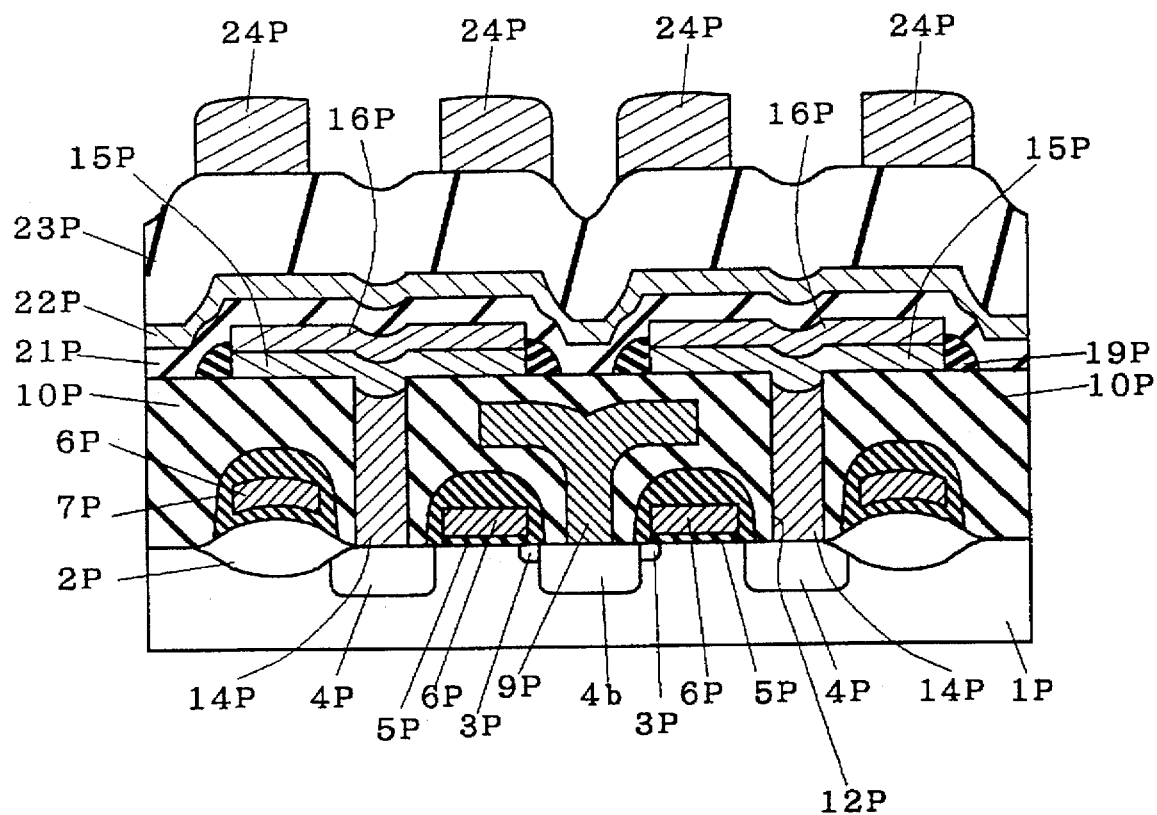
FIG. 33 is a sectional view of a semiconductor memory device in the prior art.

Thus, in this embodiment 1, since any recess is not formed on the upper surface of the polysilicon plug 14, the ferrodielectric film (or high dielectric film) 21 is formed flat without causing recess on the lower electrode 16, and its film thickness is made uniform, and the film thickness of the ferrodielectric film (or high dielectric film) 21 in the edge portion 31 of the capacitor lower electrodes (15, 16) is sufficiently thicker than in the prior art shown in FIG. 33. Accordingly, the leak current decreases outstandingly, and the capacitor reliability is enhanced. In addition, forming of the metal line layer 24 is easier than in the prior art because a recess is not formed in each portion above the capacitor lower electrodes (15, 16) of the ferrodielectric film (or high dielectric film) 21, the upper electrode 22, and the third interlayer insulating film 23.

(Embodiment 2)

A semiconductor memory device and a stacked capacitor according to a second preferred embodiment of the invention are described below by referring to the accompanying drawings. The second preferred embodiment is a further improvement from the first preferred embodiment.

Figure 14:
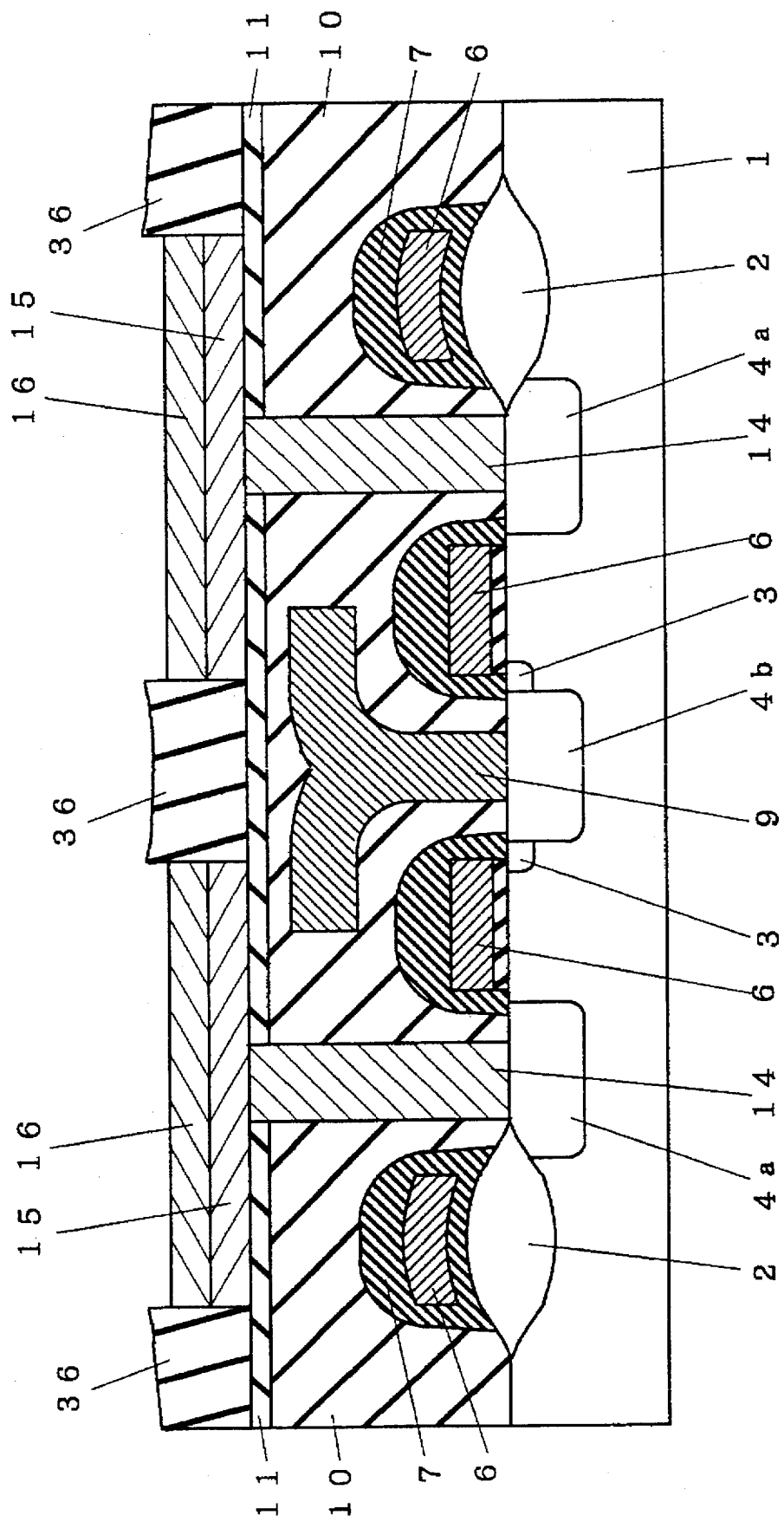
FIG. 14 is a sectional view of the semiconductor memory device in the second preferred embodiment of the invention.
Figure 15:
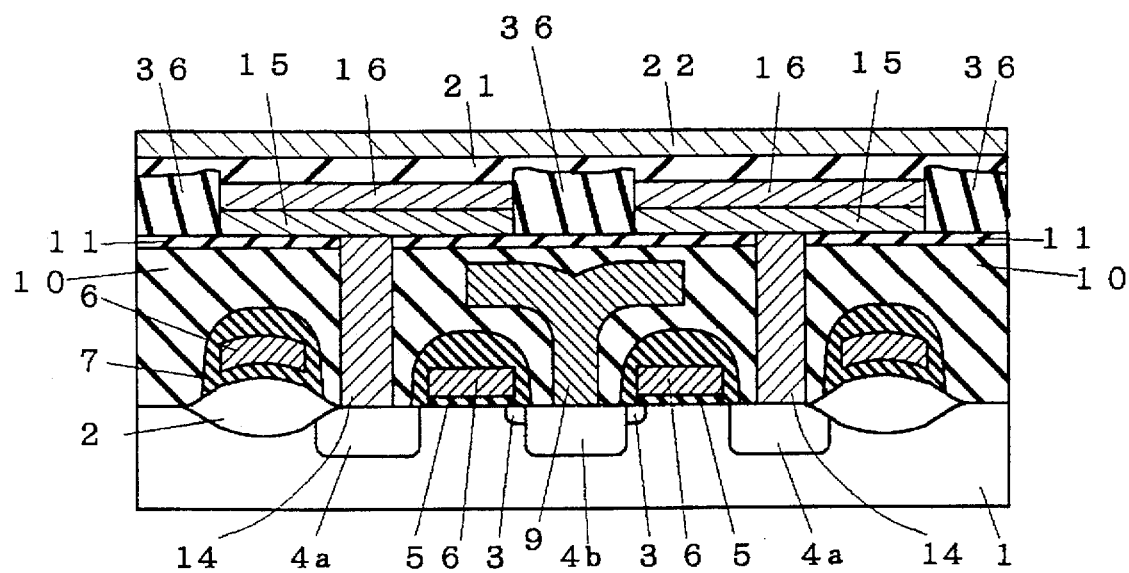
FIG. 15 is a sectional view of the semiconductor memory device in the second preferred embodiment of the invention.
Figure 16:
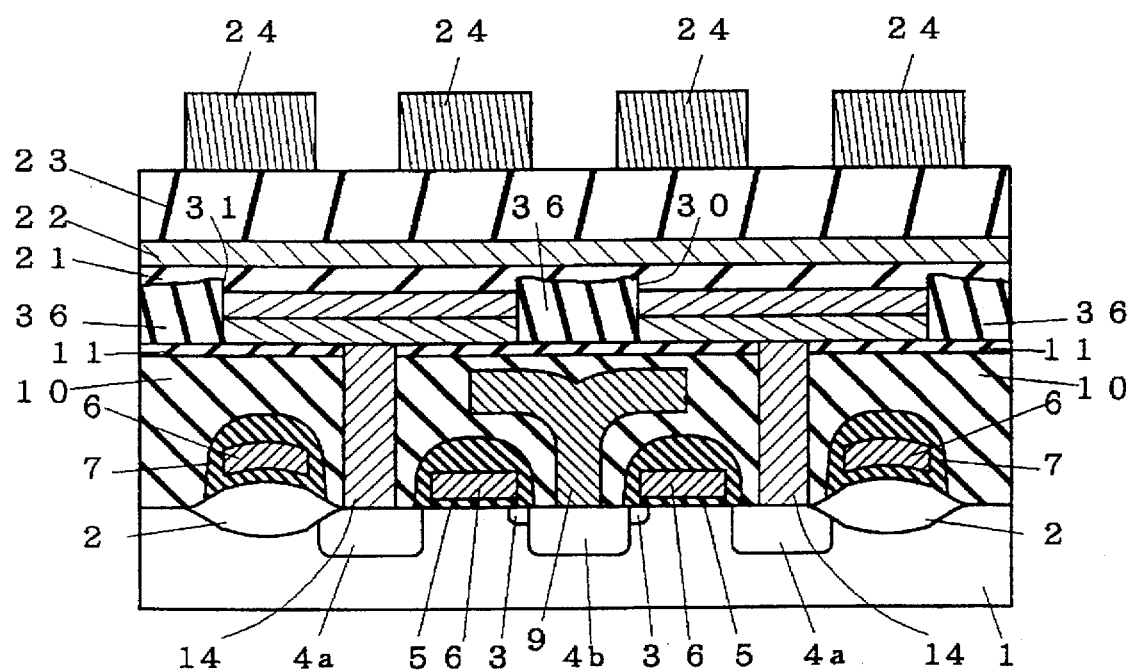
FIG. 16 is a sectional view of the semiconductor memory device in the second preferred embodiment of the invention.

FIG. 11 to FIG. 16 are sectional views showing the structure of the semiconductor memory device and stacked capacitor for describing the second preferred embodiment. Among them, FIG. 16 shows a state after completion of manufacture, and FIG. 11 to FIG. 15 show states in the process of manufacture.

The features of the semiconductor memory device of the preferred embodiment as compared with the conventional semiconductor memory device shown in FIG. 33 are as follows, as shown in FIG. 16: (1) the polysilicon plug 14 is formed by the CMP method, and (2) the oxide film spacer 36 to be formed on the side surface 30 of the capacitor lower electrodes (15, 16) is also formed by the CMP method, for thereby completely eliminating the sinking (the local step difference) from the upper surface of the lower electrode 16, occured in the edge portion 31 of the lower electrode 16. The feature (1) is same as in the embodiment 1, and the feature (2) brings about a characteristic effect herein.

As a prior art similar to the feature (2), the U.S. Pat. No. 5,335,138 is known. In this prior art, however, the problem that a recess is occured in the middle of the upper surface of the plug when forming the plug by a reflow or an etch-back method is not solved at all, and it also has its own problem in the method of forming the flat insulating film for filling up the gap between the capacitor lower electrodes by the CMP method. The latter problem may be described in detail as follows.

That is, the CMP method is, as generally known, intended to polish on pouring a slurry solution between the polishing surface of a wafer mounted on a supporting portion and a pad. Herein, the slurry solution is a KOH or NaOH solution of pH 10.4 containing silica particles, and the silica particles scratch a film surface on the polishing surface of the wafer while polishing. It is the CMP method that polishes while melting the scratched portion.

In the technology disclosed in the U.S. Pat. No. 5,335,138, however, as described in FIG. 3 and line 34 to line 43 of column 6, on the upper surface of the lower electrode of the capacitor and in the gap between the lower electrodes, the insulating film to be polished by the CMP method (it's a silicon nitride film or silicon oxide film) is evaporated, and by polishing this insulating film directly by the CMP method, the flat film is formed in the gap between the lower electrodes. When using this method, however, the surface of the lower electrode such as Pt is scratched by the silica particles in the slurry solution. But, the scratch on the metal surface of Pt or the like is not melted but is left over, and the damage is left over on the surface of the lower electrode after the CMP polishing, and the characteristic of the lower electrode deteriorates.

The embodiment 2 is intended to present a structure overcoming the problems of the prior art disclosed in the U.S. Pat. No. 5,335,138, and its manufacturing method.

The manufacturing process of the semiconductor memory device of the embodiment 2 is described according to FIG. 11 to FIG. 16, and the features of the structure of this semiconductor memory device and stacked capacitor are unveiled. In FIG. 11 to FIG. 16, the same reference numerals as in the embodiment 1 represent the same components.

First, a polysilicon film is polished by the CMP method, and thereby a polysilicon plug 14 is formed. Up to this step, the process is same as in FIG. 1 to FIG. 5 mentioned in the embodiment 1.

Figure 11:
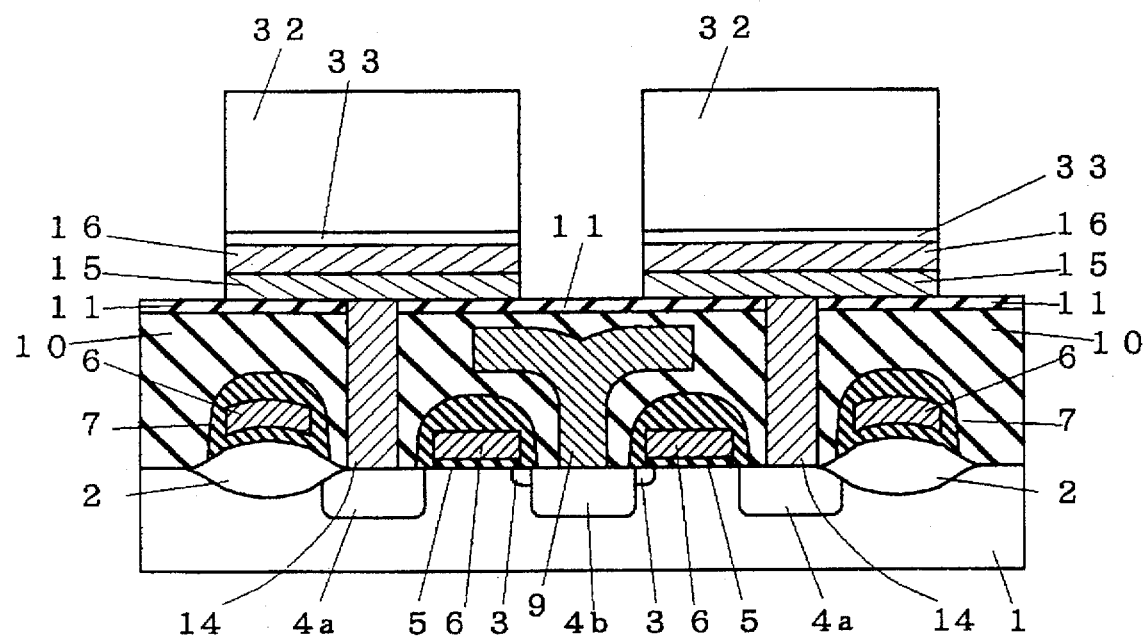
FIG. 11 is a sectional view of a semiconductor memory device in a second preferred embodiment of the invention.

Next, same as in the embodiment 1, on the upper surfaces of both a second interlayer insulating film 11 and the polysilicon plug 14, a Ti derivative film to be used as a barrier layer 15 and a Pt or similar film to be used as a lower electrode 16 are formed sequentially by a sputtering method or the like. Furthermore, on the entire surface of the film of the lower electrode 16, a film of an other material (this film corresponds to a stopper film) is formed to be used as a stopper member of the CMP polishing. Forming a resist mask 32 on an upper surface of the stopper film, the above three films formed sequentially on the upper surface of the second interlayer insulating film 11 are processed simultaneously by the dry etching method, using the resist mask 32 as mask, and the barrier layer 15, lower electrode 16, and stopper film 33 are formed. Herein, as the stopper film 33, in relation to the selection ratio with a silicon oxide film 34, a material having a smaller etching rate than the silicon oxide film 34, specifically, a silicon nitride film or titanium film is used (FIG. 11).

Figure 12:
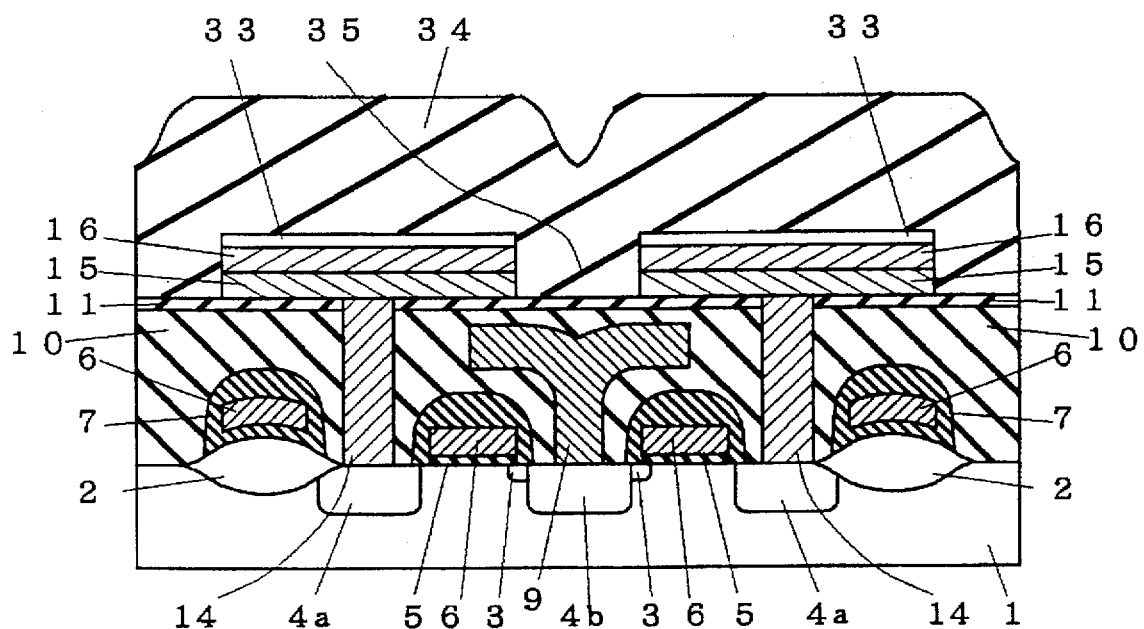
FIG. 12 is a sectional view of the semiconductor memory device in the second preferred embodiment of the invention.

After eliminating the resist 32, an oxide film 34 (herein a silicon oxide film is used) is formed for covering the capacitor lower electrodes (15, 16), the stopper film 33 thereon, and the gap portions 35 between the capacitor lower electrodes (15, 16) and the adjacent other capacitor lower electrodes (15, 16) (FIG. 12).

Figure 13:
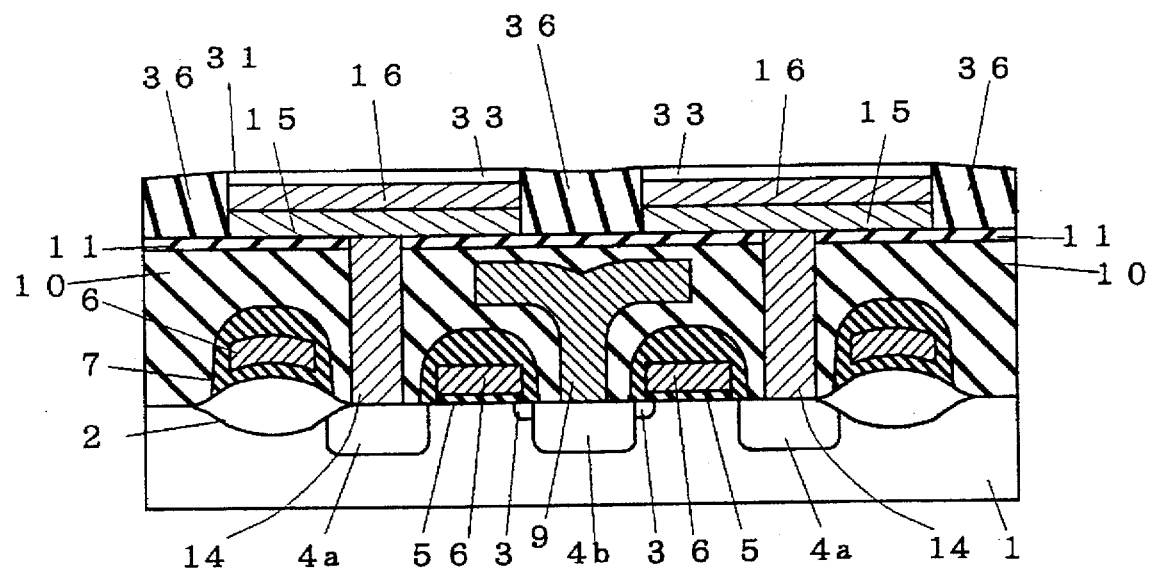
FIG. 13 is a sectional view of the semiconductor memory device in the second preferred embodiment of the invention.

Then, using the CMP method, the oxide film 34 is polished so as not to cause a local step difference in the edge portion 31 of the capacitor lower electrode, and a smooth oxide film spacer 36 is buried in the gap portion 35 between the capacitor lower electrodes (FIG. 13). At this time, since the stopper film 33 functions as the stopper layer of the CMP method, any local step difference is not caused in the edge portion 31 of the lower electrode, and the lower electrode 16 is not directly polished by the CMP method, so that the characteristic of the lower electrode 16 does not deteriorate.

The stopper film 33 polished by the CMP method is consequently eliminated by a wet etching using, for example, hot phosphate solution. As a result, the oxide film spacer 36 is in a shape raised higher than the upper surface of the lower electrode 16 (FIG. 14). That is, the height of an edge portion of the upper surface of the oxide film spacer 36 from the upper surface of the second interlayer insulating film 11 is formed as being projected higher than the height of the upper surface of the capacitor lower electrodes (15, 16) from the second interlayer insulating film 11.

Afterwards, a ferrodielectric film or high dielectric film 21 is formed by the sputtering method or MOCVD method and the like, and an upper electrode 22 is formed thereon (FIG. 15). After forming a third interlayer insulating film 23, a metal line material is formed and processed, thereby forming a metal line layer 24 (FIG. 16). At this time, an upper surface of the ferrodielectric (or high dielectric) film 21, that is, each of the upper electrode 22 and third interlayer insulating film 23 is a flat film completely free from recess on the entire surface, so that formation of the metal line layer 24 is easier than in the embodiment 1.

Thus, in the semiconductor memory device or stacked capacitor of the embodiment 2, there is no recess in the upper surface and middle of the polysilicon plug 14, while the local step difference in the edge portion of the capacitor lower electrode is completely eliminated, so that the leak current further decreases, thereby outstandingly improving the electric characteristic of the capacitor.

(Embodiment 3)

A semiconductor memory device and a stacked capacitor of a third preferred embodiment of the invention are described by reference to FIG. 17 to FIG. 26.

FIG. 17 to FIG. 26 are sectional views showing the structure of the semiconductor memory device and stacked capacitor for describing the third preferred embodiment. In FIG. 17 to FIG. 26, the same reference numerals as in the embodiment 1 refer to the same components.

The semiconductor memory device of the preferred embodiment differs from the conventional semiconductor memory device shown in FIG. 33 in the following points.

That is, on a side wall of a contact hole 12 opened by a resist mask, an other oxide film spacer 41 different from an oxide film spacer 19 described below is formed, and thereby a diameter of the contact hole 12 is reduced. At this time, in particular, the diameter of the lower side of the contact hole 12, that is, the semiconductor substrate side is further reduced. As a result, when forming a polysilicon plug 14 by a CMP method, by slightly over-polishing (for example, about 100 nm), the upper diameter of the contact hole 12 is further reduced from before polishing by the CMP method, and moreover the shape of the upper surface of the polysilicon plug 14 formerly having a recess has been improved. As a result of the improvement, by the reduced portion of the upper diameter of the capacitor contact hole 12, the overlap margin on the transfer process of the capacitor lower electrode and capacitor contact (plug) is increased.

Successively, the manufacturing process is described according to FIG. 17 to FIG. 26.

Figure 17:
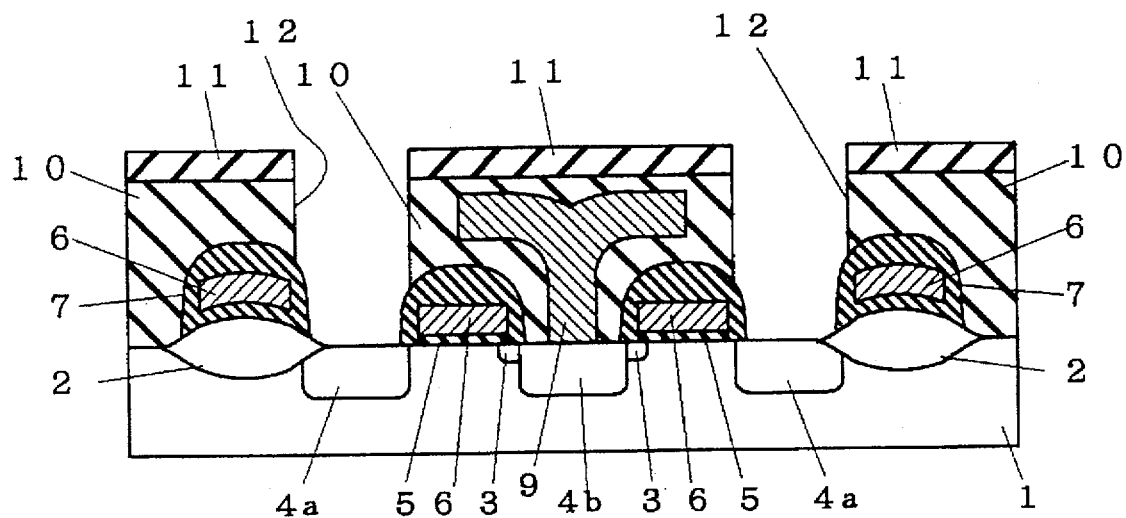
FIG. 17 is a sectional view of a semiconductor memory device in a third preferred embodiment of the invention.

As shown in FIG. 17, using a resist mask not shown, the capacitor contact hole 12 is opened. The process up to this step is same as in FIG. 1 to FIG. 3 in the embodiment 1.

Figure 18:
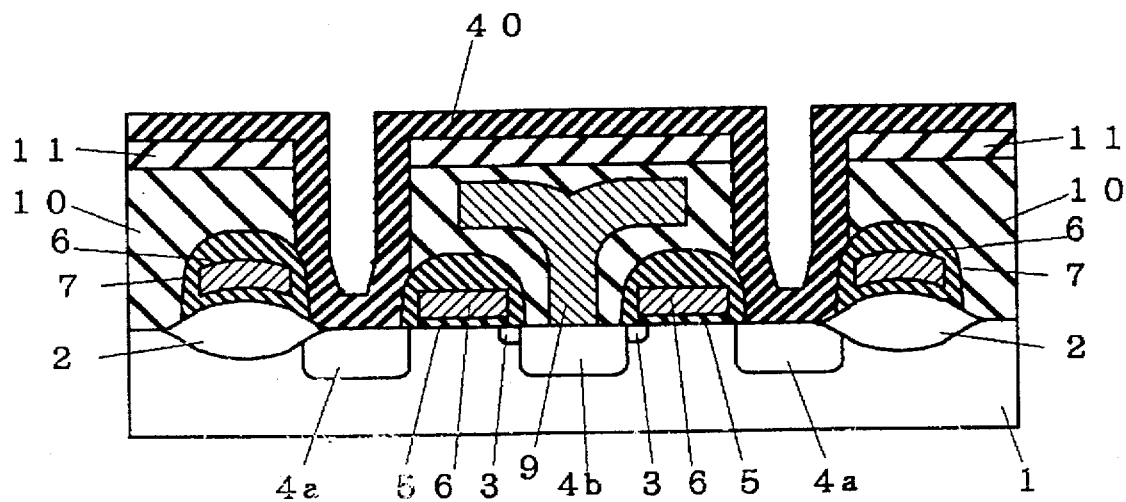
FIG. 18 is a sectional view of the semiconductor memory device in the third preferred embodiment of the invention.

Next, a silicon oxide film 40 (for example, a TEOS oxide film formed by a reduced pressure CVD method) as an oxide film for framing spacer for reducing the contact diameter is formed on a bottom surface and the side wall of the contact hole 12 and on an upper surface of the second interlayer insulating film 11 (FIG. 18).

Figure 19:
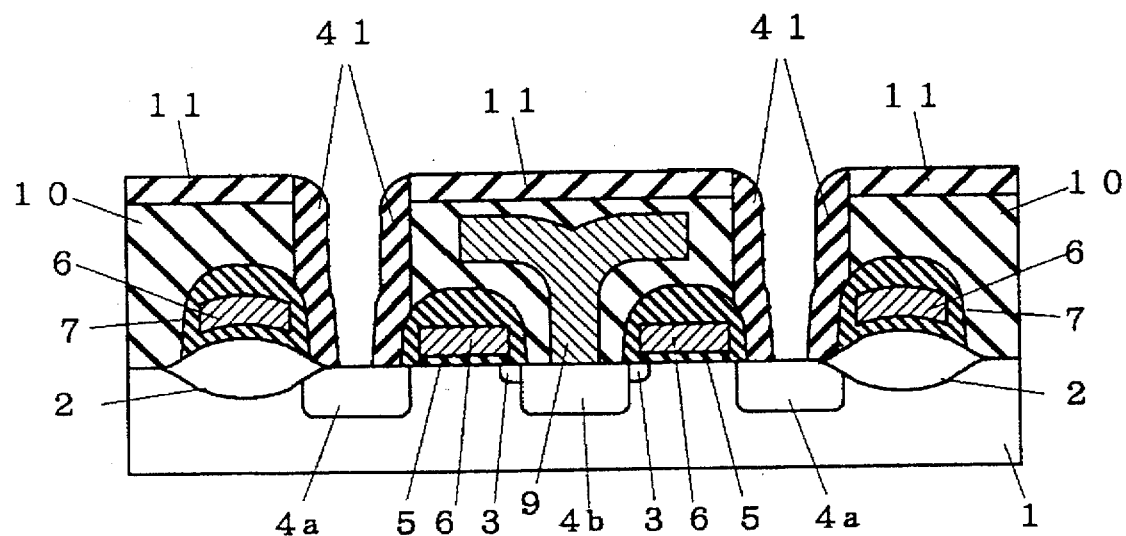
FIG. 19 is a sectional view of the semiconductor memory device in the third preferred embodiment of the invention in the invention.

Consequently, by etching the silicon oxide film 40 by an anisotropic dry etching, the oxide film spacer 41 is formed on the side wall of the contact hole 12 and on a part of its bottom (FIG. 19). As a result, the oxide film spacer 41 forms an opening having a smaller aperture diameter than the diameter of the contact hole 12 in the space in the contact hole 12.

Figure 20:
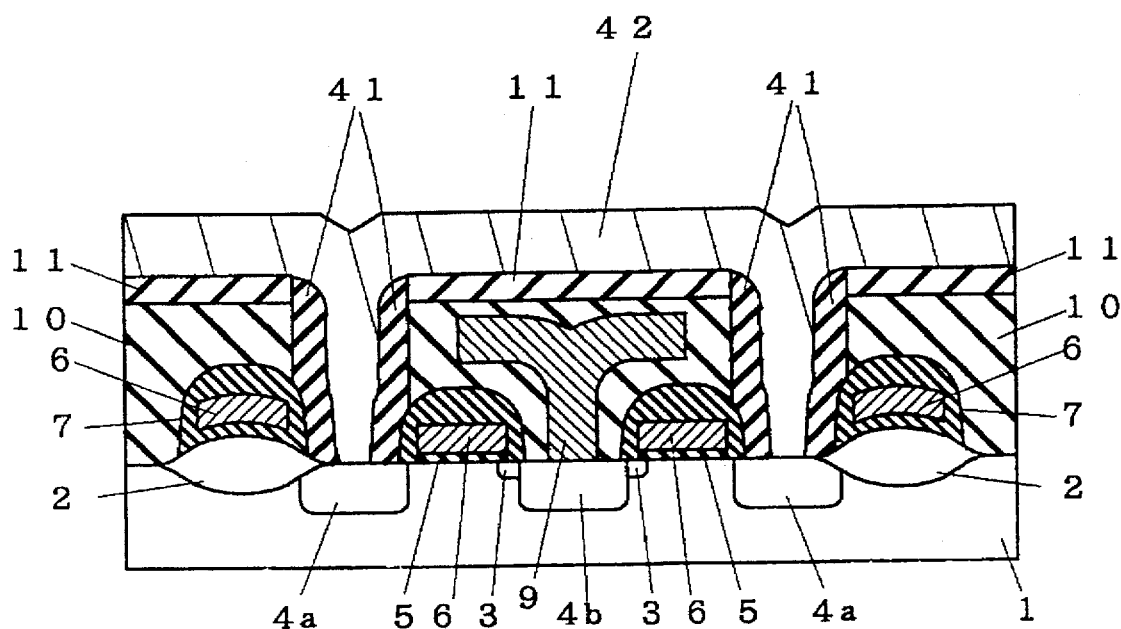
FIG. 20 is a sectional view of the semiconductor memory device in the third preferred embodiment of the invention.

Furthermore, to fill in the opening in the contact hole 12, a polysilicon film 42 is formed on the upper surface of the second interlayer insulating film 11, and a plug layer is formed (FIG. 20).

Figure 21:
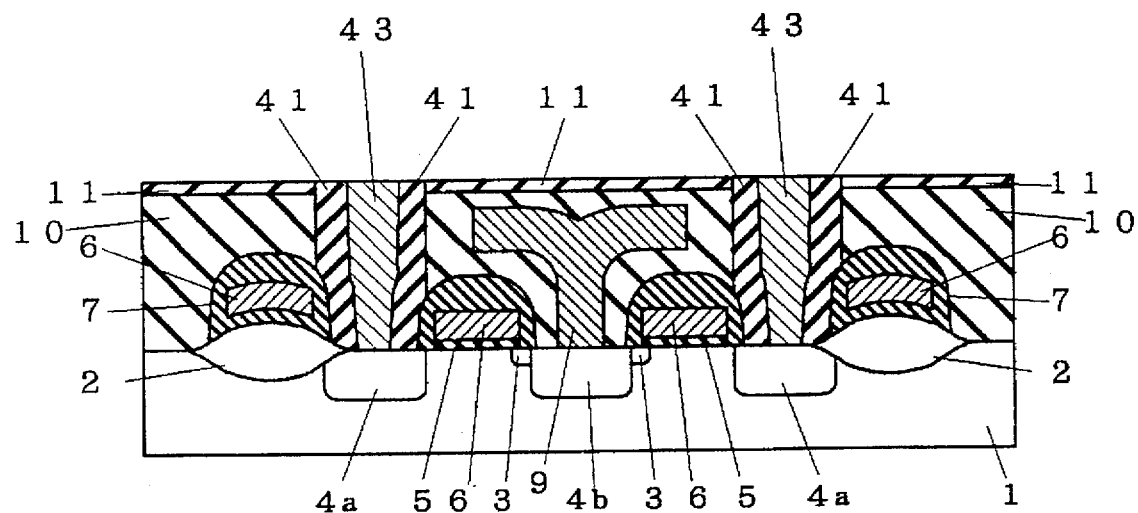
FIG. 21 is a sectional view of the semiconductor memory device in the third preferred embodiment of the invention.

Next, using the CMP method, in order not to form such a local step difference as to sink an upper portion of the polysilicon plug 43, the polysilicon film 42 (plug layer) is polished flatly, and the outermost second layer insulating film 11 is left over by about 30 to 100 nm, thereby forming the polysilicon plug 43 (FIG. 21).

Figure 22:
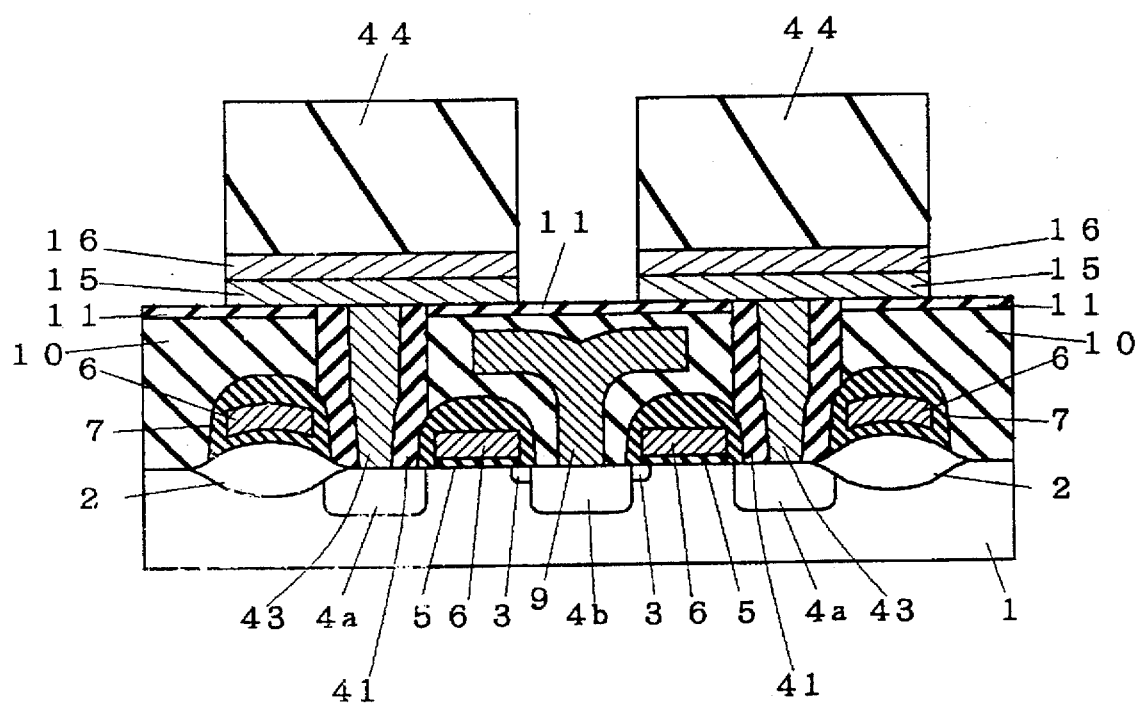
FIG. 22 is a sectional view of the semiconductor memory device in the third preferred embodiment of the invention.
Figure 23:
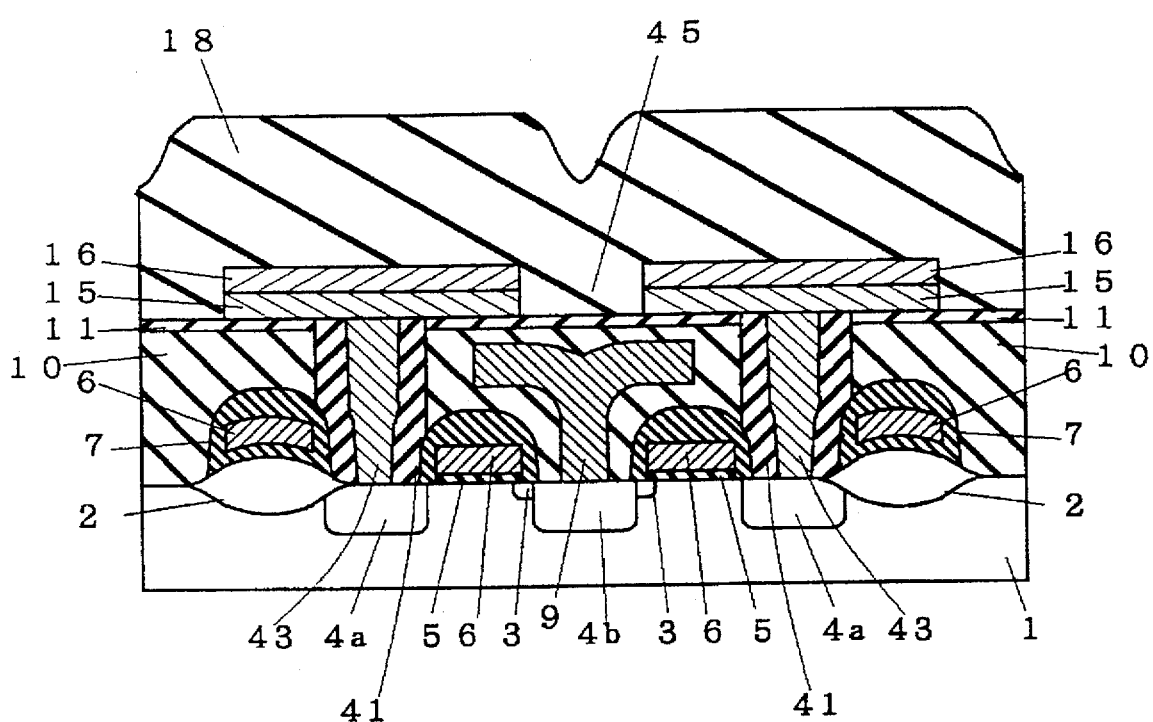
FIG. 23 is a sectional view of the semiconductor memory device in the third preferred embodiment of the invention.

On an upper surface of the polysilicon plug 43 and on an upper surface of a portion corresponding to the periphery of the polysilicon plug 43 in the residual second interlayer insulating film 11, films to be used as a barrier layer 15 and a lower electrode 16 are formed sequentially, and the capacitor lower electrodes (15, 16) are processed and formed by using a resist 44 as mask (FIG. 22). After eliminating the resist 44, a silicon oxide film 18 for forming an oxide film spacer in a gap portion 45 of the capacitor lower electrodes (15, 16) is formed on the upper surface of the exposed second interlayer insulating film 11 and on the upper and side surfaces of the capacitor lower electrodes (15, 16) (FIG. 23).

Figure 24:
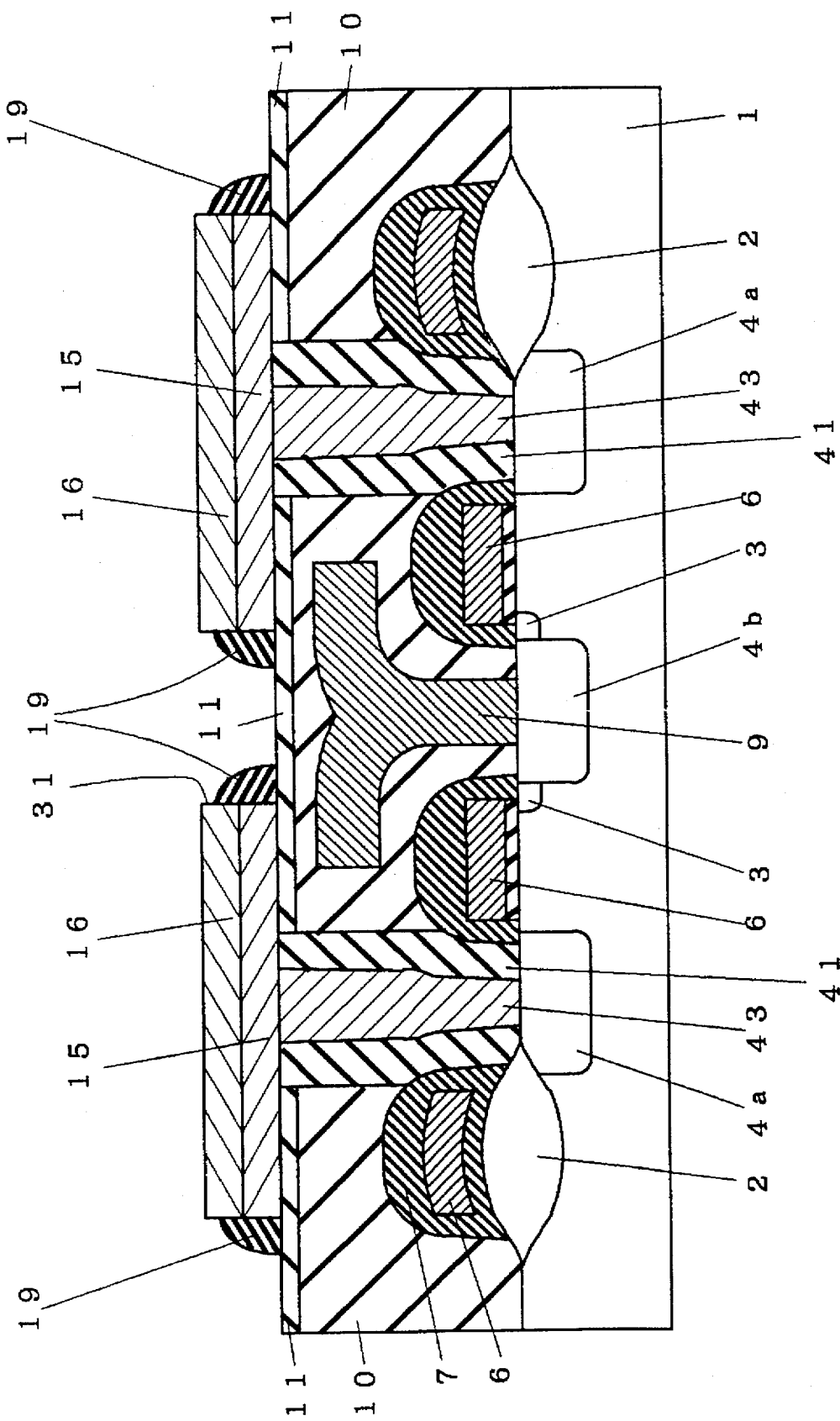
FIG. 24 is a sectional view of the semiconductor memory device in the third preferred embodiment of the invention.

In consequence, with an anisotropic dry etching, by etching the silicon oxide film 18 so as not to cause the local step difference in the edge portion 31 of the lower electrode 16, an oxide film spacer 19 is spaced in the gap portion 45 between both the capacitor lower electrodes (FIG. 24). This point is same as the constitution in the embodiment 1.

Figure 25:
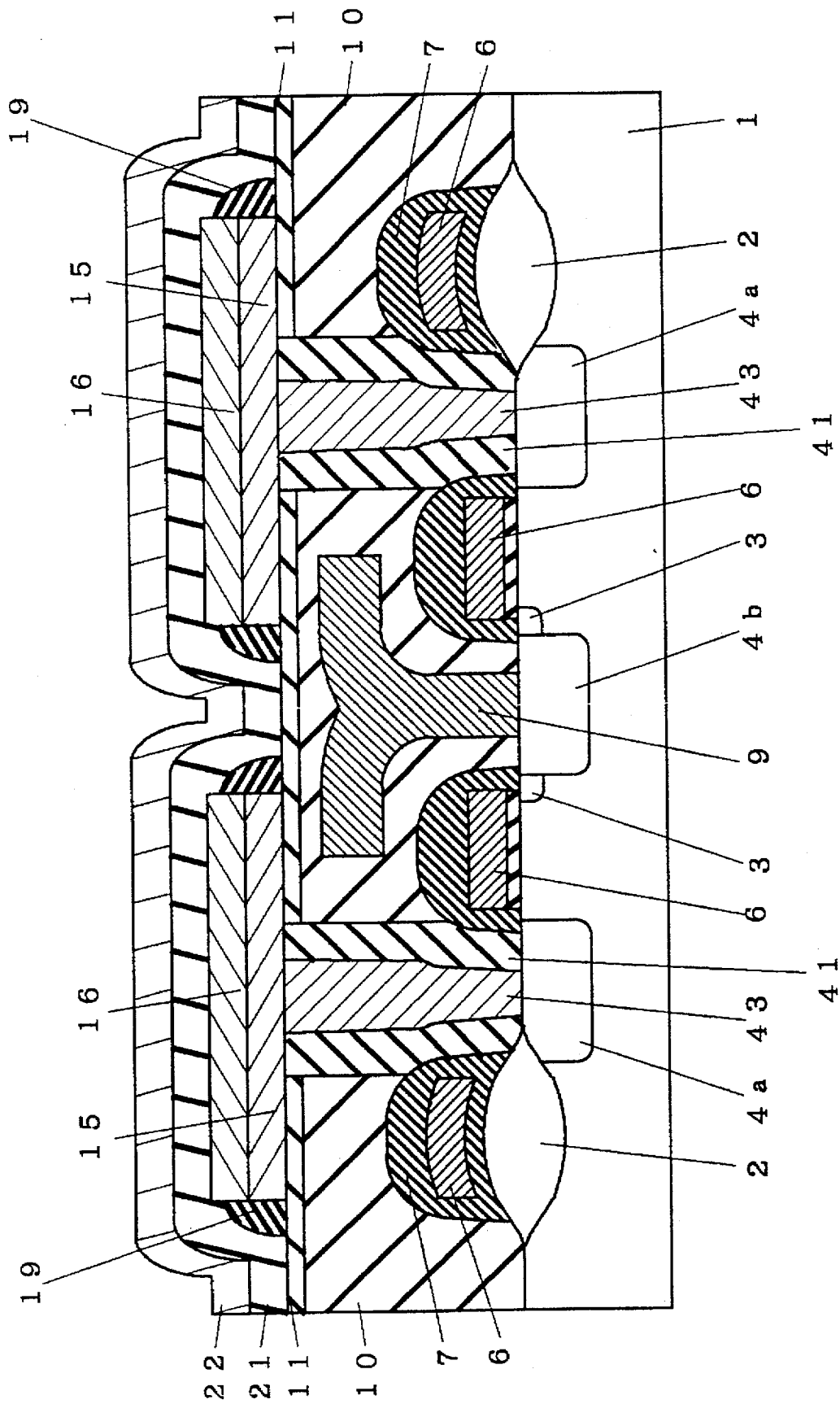
FIG. 25 is a sectional view of the semiconductor memory device in the third preferred embodiment of the invention.
Figure 26:
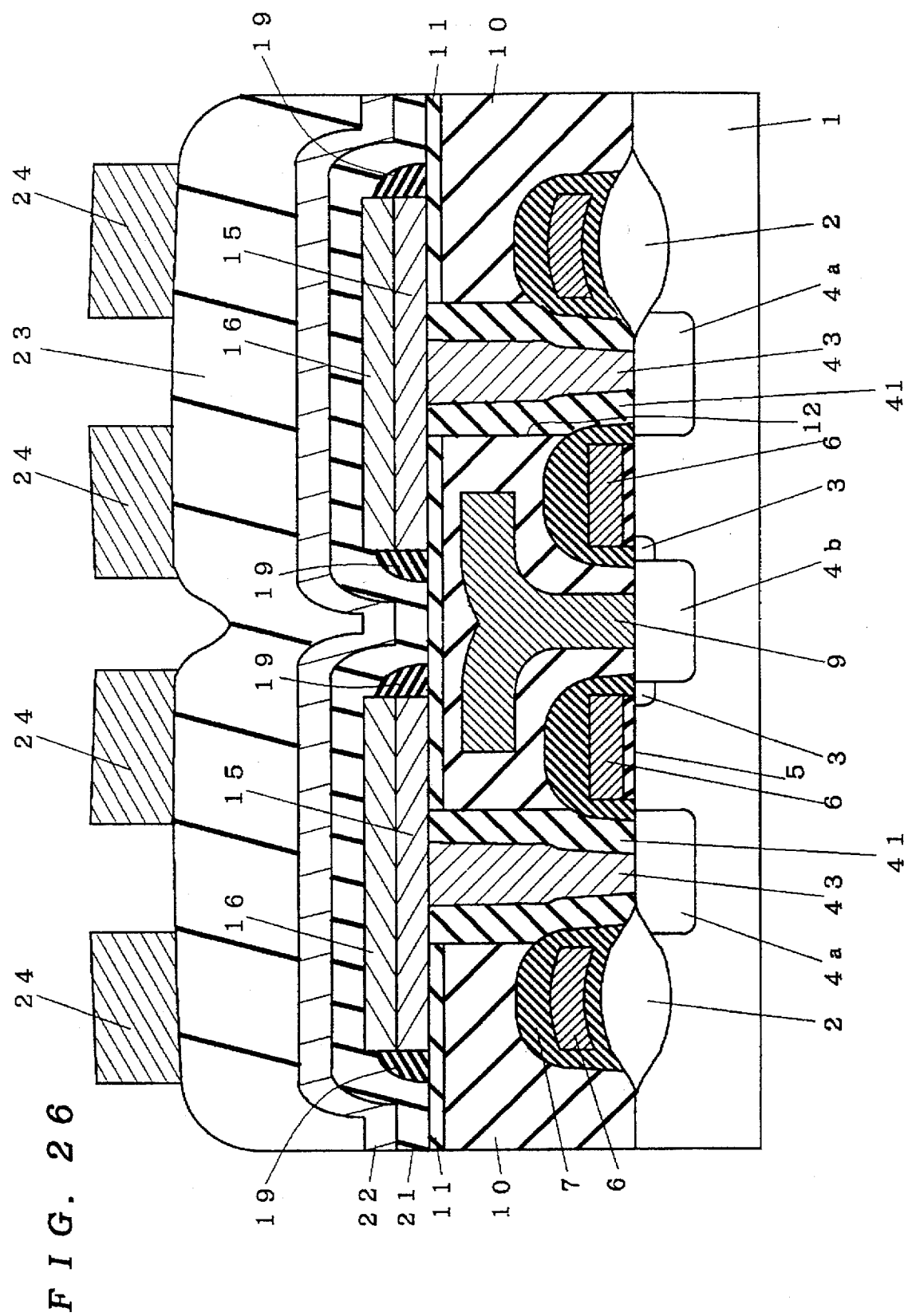
FIG. 26 is a sectional view of the semiconductor memory device in the third preferred embodiment of the invention.

Afterwards, forming a ferrodielectric (or high dielectric) film 21, an upper electrode 22 is formed thereon (FIG. 25). After forming a third interlayer insulating film 23, a metal line material is formed and processed, thereby forming a metal line layer 24 (FIG. 26).

In this embodiment 3, the same effects as described in the first preferred embodiment are obtained.

(Embodiment 4)

Figure 32:
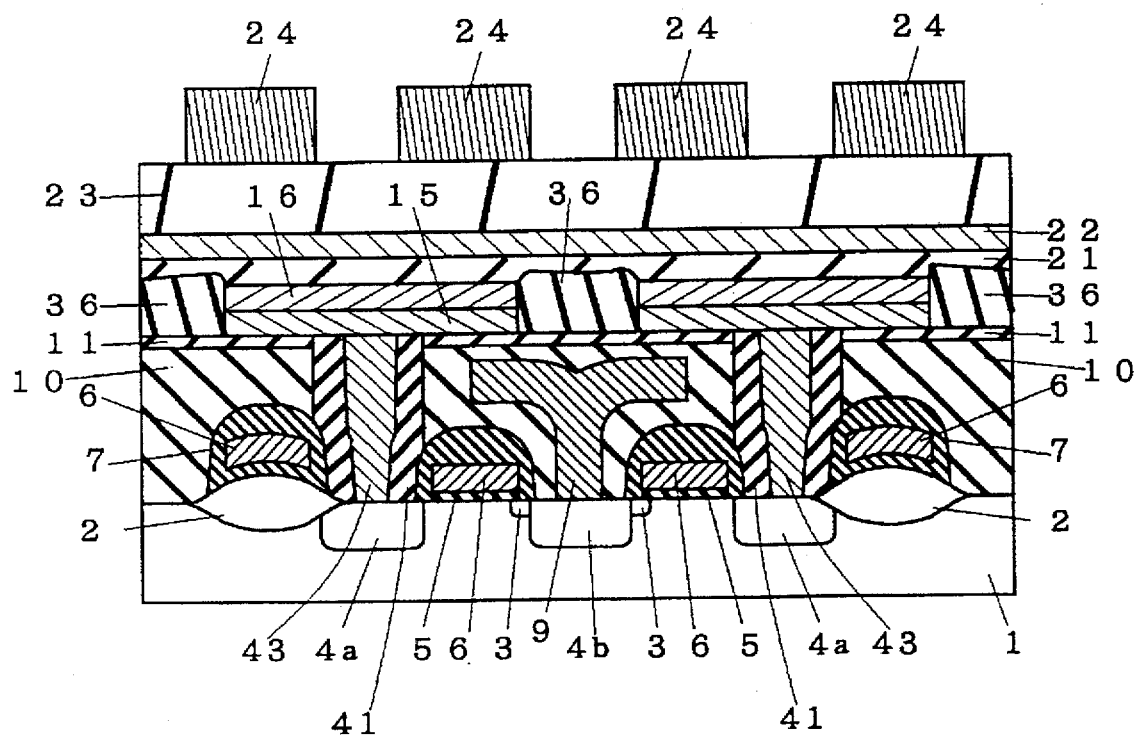
FIG. 32 is a sectional view of the semiconductor memory device in the fourth preferred embodiment of the invention.

The embodiment 4 is a combination of the art of embodiment 3 and the art of embodiment 2. That is, as shown in the sectional view in FIG. 32, an oxide film spacer for framing the capacitor lower electrodes (15, 16) at the side surface is replaced by the oxide film spacer 36 in the embodiment 2, instead of the oxide film spacer (19 in FIG. 26) in the embodiment 3. Therefore, in the embodiment 4, in addition to the intrinsic effect of the embodiment 3 that the transfer overlap margin between the capacitor contact and the capacitor lower electrodes is increased, the effect of the embodiment 2 are also realized.

Incidentally, the oxide film spacer 36 corresponds to the "other oxide film Spacer" from the viewpoint of the oxide film spacer 41 in the contact hole 12, and, to the contrary, the oxide film spacer 41 corresponds to the "other oxide film" from the viewpoint of the oxide film spacer 36.

Figure 27:
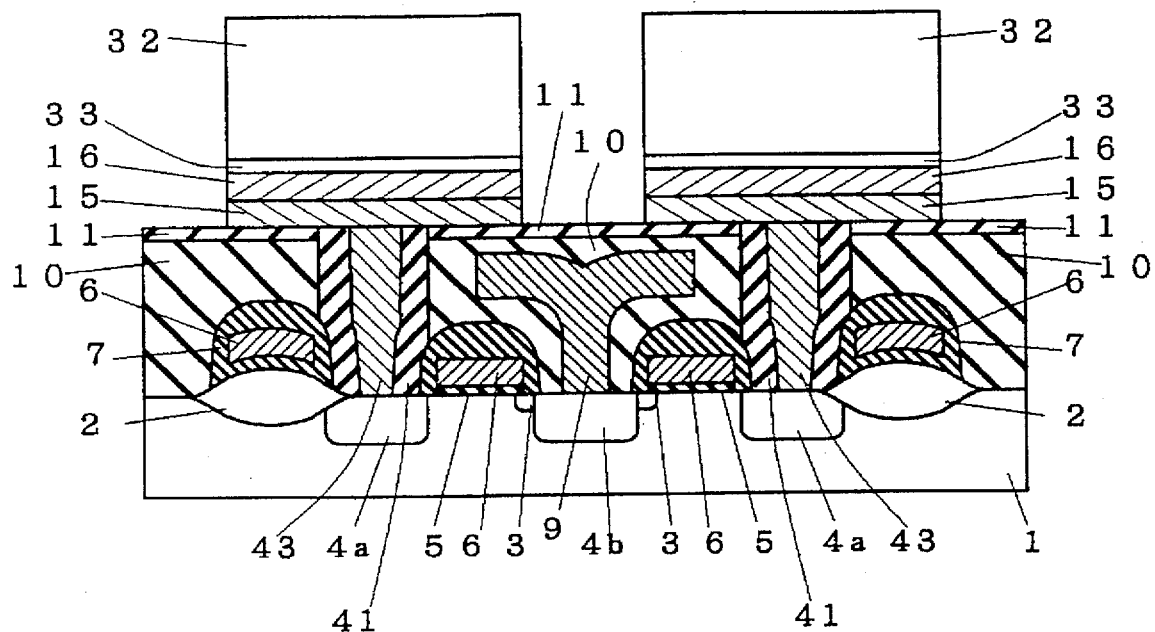
FIG. 27 is a sectional view of a semiconductor memory device in a fourth preferred embodiment of the invention.
Figure 28:
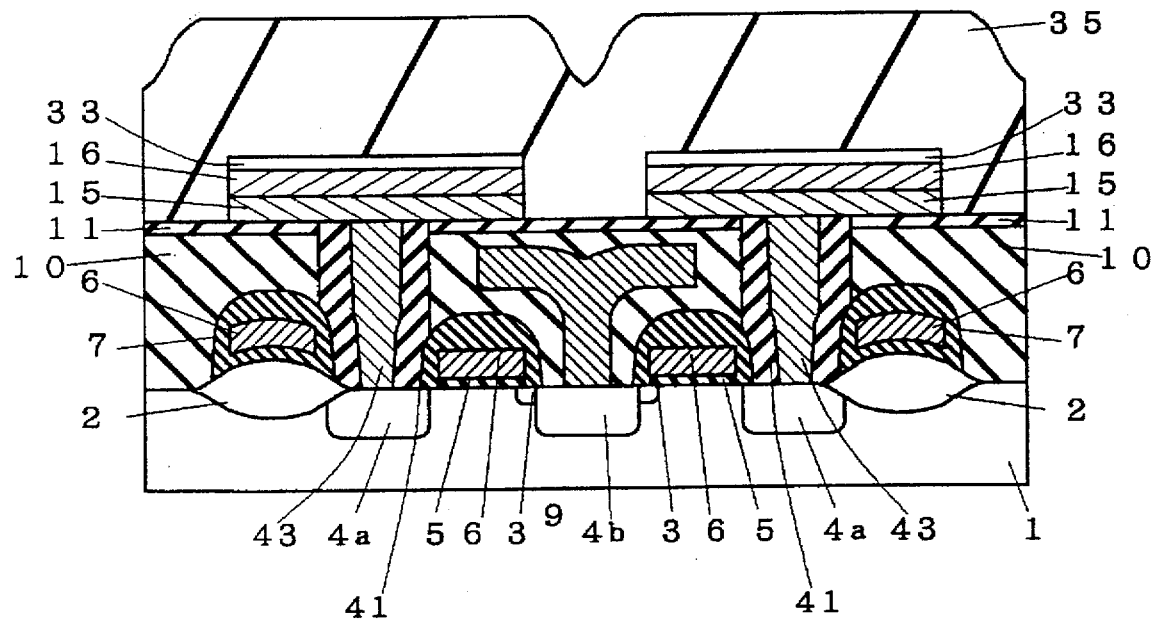
FIG. 28 is a sectional view of the semiconductor memory device in the fourth preferred embodiment of the invention.
Figure 29:
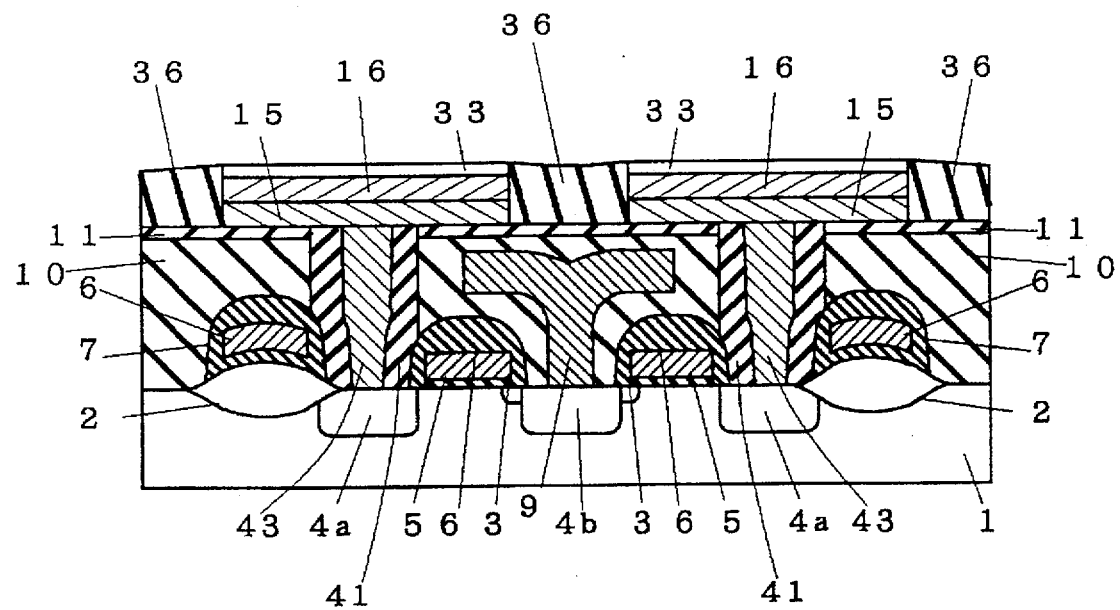
FIG. 29 is a sectional view of the semiconductor memory device in the fourth preferred embodiment of the invention.
Figure 30:
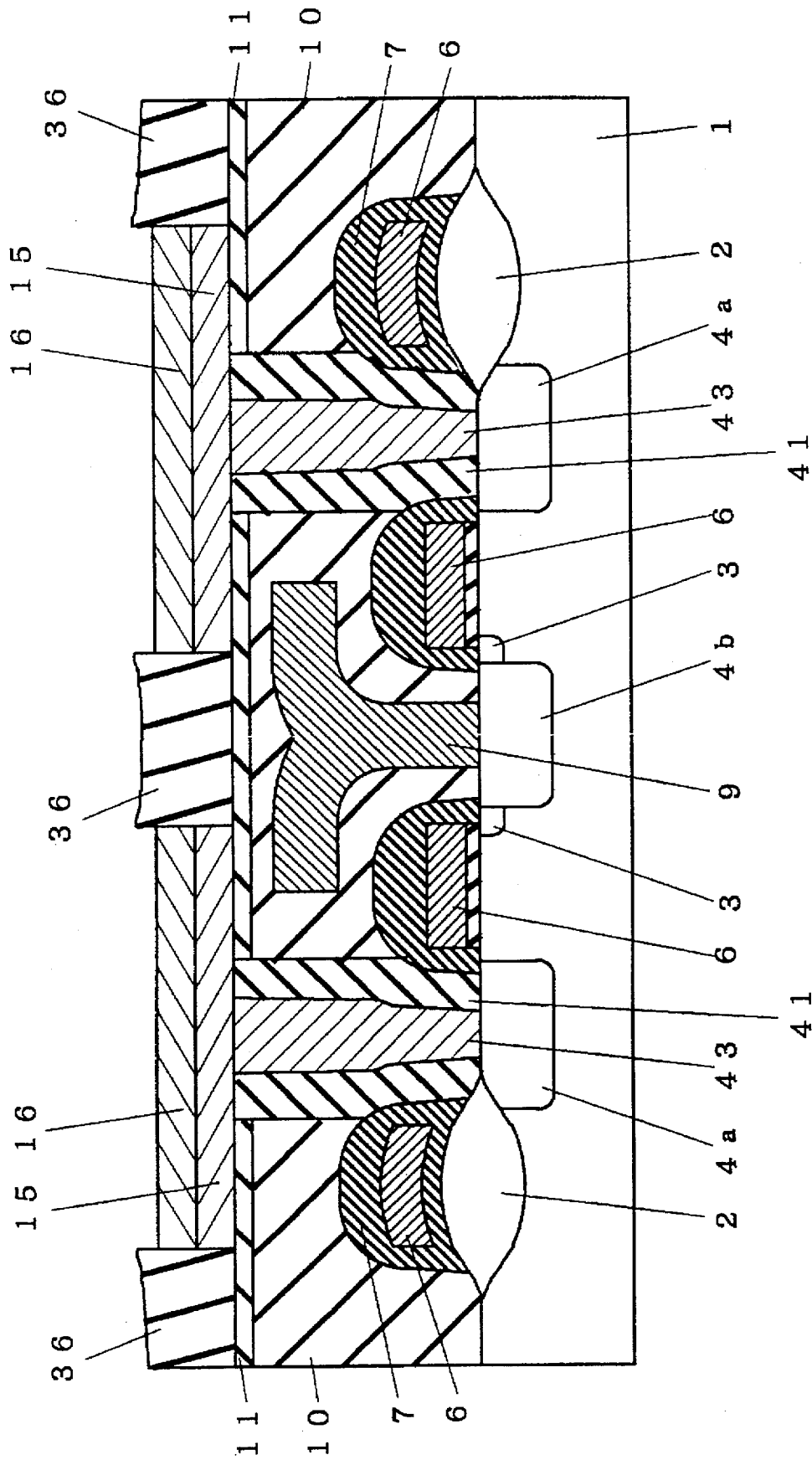
FIG. 30 is a sectional view of the semiconductor memory device the fourth preferred embodiment of the invention.
Figure 31:
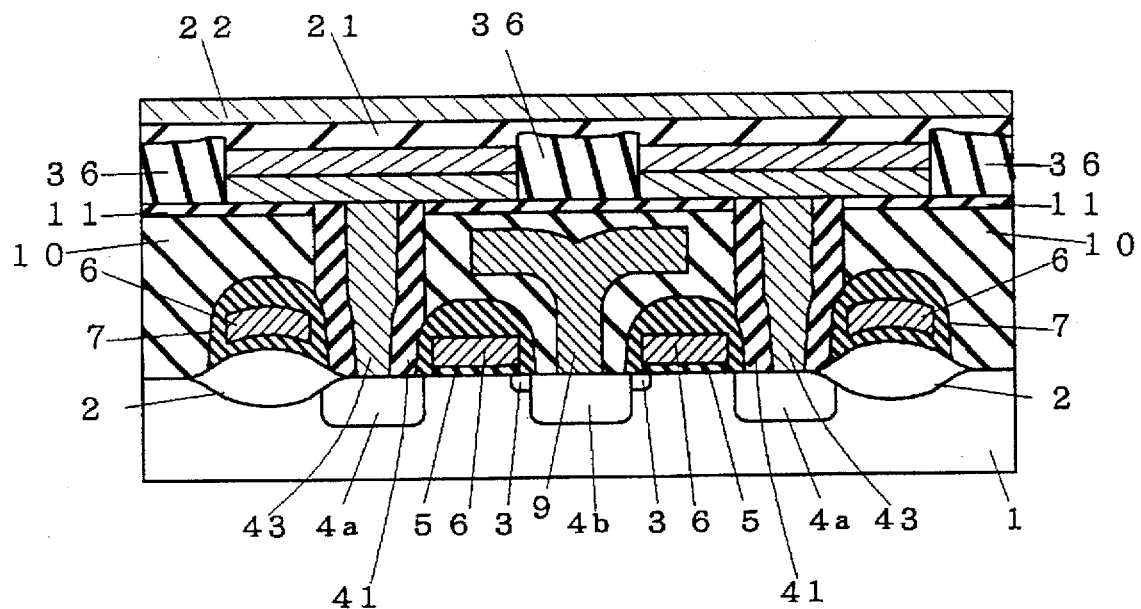
FIG. 31 is a sectional view of the semiconductor memory device in the fourth preferred embodiment of the invention.

A manufacturing method of the embodiment 4 is shown in sectional views in FIG. 27 to FIG. 30. The forming method of the oxide film spacer 41 and the plug 14 in FIG. 27 is same as in FIG. 17 go FIG. 21, and the processes after FIG. 27 are same as shown in FIG. 11 to FIG. 16 in the embodiment 2, and their description are omitted.

(Characteristic Effects of the Preferred Embodiment)

This preferred embodiment brings about the following effects.

(1) Since there is no recess in the middle of the lower electrodes in the ferrodielectric (high dielectric) film capacitor of the semiconductor memory device, the local step difference in the edge portion of the lower electrode can be outstandingly decreased, and hence as compared with the semiconductor memory device using the conventional ferrodielectric (or high dielectric) film capacitor having the local step difference, the deterioration of electric characteristic due to an increase of the leak current of the capacitor or the like is eliminated;

(2) For reduction of the diameter of the capacitor contact of the semiconductor memory device, since the diameter reduction method by the oxide film spacer and flat plug forming method by the CMP method are combined, the transfer overlap margin of the capacitor contact and the capacitor lower electrode can be increased; and (3) Since the local step difference caused in the process of forming the stacked capacitor can be decreased, the processing and forming of the metal line layer formed on the capacitor across the third interlayer insulating film can be outstandingly facilitated.

In these preferred embodiments 1 to 4, the interlayer insulating films for covering the transistors are formed by using two types of insulating films, that is, the first and second interlayer insulating films 10, 11, but three or more types of insulating films may be also used. In such a case, the outermost insulating film of the interlayer insulating films is an insulating film composed of a material usable as a stopper member for the CMP method, which exactly corresponds to the second interlayer insulating film, and all insulating films beneath this film are smoothly formable films,-and these insulating films, collectively, correspond exactly to the first interlayer insulating film.

While the invention has been shown and described in detail, the foregoing description is in all aspects illustrative and not restrictive. It is therefore understood that numerous modifications and variations can be devised without departing from the scope of the invention.

I claim:

1. A semiconductor memory comprising:

a semiconductor substrate, a transistor having at least one electrode formed on a principal surface of said semiconductor substrate, said transistor further including at least one diffusion layer formed in said principal surface, a first interlayer insulating film formed smoothly on said principal surface of said semiconductor substrate so as to cover said transistor, a second interlayer insulating film of a different type from said first interlayer insulating film and formed flatly on an upper surface of said first interlayer insulating film, a contact hole formed in said second and first interlayer insulating films and extending to an upper surface of said diffusion layer, a plug filling at least part of said contact hole and having a flat upper surface having no step portions, said flat upper surface of said plug being at a same height as a height of an upper surface of said second interlayer insulation film as measured from the principal surface of said semiconductor substrate, and a capacitor lower electrode formed on said upper surface of said plug and on said upper surface of said second interlayer insulating film around a periphery of said upper surface of said plug.

2. The semiconductor memory of claim 1, wherein said second interlayer insulating film is polished flat and to a specified film thickness by a chemical mechanical polishing method, and said upper surface of said plug is also polished flat by said chemical mechanical polishing method.

3. The semiconductor memory of claim 2, wherein said second interlayer insulating film consists essentially of an insulating film having a smaller etching rate than the etching rate of a film for forming said plug.

4. The semiconductor memory of claim 2, wherein said first interlayer insulating film is doped with at least one dopant and said second interlayer insulating film is not doped with said at least one dopant.

5. The semiconductor memory of claim 4, wherein said second interlayer insulating film consists essentially of a silicon oxide film, and said first interlayer insulating film consists essentially of said silicon oxide film containing said at least one dopant.

6. The semiconductor memory of claim 5, wherein said second interlayer insulating film consists essentially of a TEOS oxide film, and said first interlayer insulating film consists essentially of a TEOS oxide film containing both boron and phosphorus dopants.

7. The semiconductor memory of claim 5, wherein said second interlayer insulating film consists essentially of a silicate glass, and said first interlayer insulating film consists essentially of a silicate glass containing both boron and phosphorus dopants.

8. The semiconductor memory of claim 1, further comprising:

an oxide film spacer formed on a part of said upper surface of said second interlayer insulating film and a side surface of said capacitor lower electrode, and a dielectric film formed so as to cover an upper surface of said capacitor lower electrode and an upper surface of said oxide film spacer.

9. The semiconductor memory of claim 8, wherein an other capacitor lower electrode is further formed on said upper surface of said second interlayer insulating film so as to be adjacent to said capacitor lower electrode across a gap, and said oxide film spacer is formed in a built-up form so as to completely fill in said gap, and so as not to sink from each of the upper surfaces of said capacitor lower electrode and said other capacitor lower electrode in each of edge portions of said capacitor lower electrode and said other capacitor lower electrode.

10. The semiconductor memory of claim 9, wherein said oxide film spacer is formed by polishing an oxide film by said chemical mechanical polishing method, said oxide film formed on said upper surface of said capacitor lower electrode and said upper surface of said other capacitor lower electrode so as to fill in said gap.

11. The semiconductor memory of claim 8, wherein said dielectric film consists essentially of a ferrodielectric film or a high dielectric film.

12. The semiconductor memory of claim 8, further comprising:

a capacitor upper electrode formed on an upper surface of said dielectric film, a third interlayer insulating film formed on an upper surface of said capacitor upper electrode, and a metal line layer formed on an upper surface of said third layer insulating film.

13. The semiconductor memory of claim 1, wherein said plug is formed on a side wall of said contact hole and said part of upper surface of said diffusion layer, thereby filling in said contact hole.

14. The semiconductor memory of claim 1, further comprising:

an oxide film spacer formed on the entire surface of a side wall of said contact hole, having a smaller aperture diameter than the diameter of said contact hole, and having an upper surface formed flat in the same height as the height of said upper surface of said second interlayer insulating film from said principal surface of said semiconductor substrate, wherein said plug is formed to fill in the aperture of said oxide film spacer, and said capacitor lower electrode is formed on said upper surface of said plug, on said upper surface of said oxide film spacer, and on said upper surface of said second interlayer insulating film.

15. The semiconductor memory of claim 14, wherein said oxide film spacer consists essentially of a silicon oxide film.

16. The semiconductor memory of claim 14, further comprising:

an other capacitor lower electrode further formed on said upper surface of said second interlayer insulating film so as to be adjacent to said capacitor lower electrode through a gap, an other oxide film spacer for filling in said gap completely, being formed flat so as not to sink from each of upper surfaces of said capacitor lower electrode and said other capacitor lower electrode in each of edge portions of said capacitor lower electrode and said other capacitor lower electrode, a dielectric film formed on each of said upper surfaces of said capacitor lower electrode and said other capacitor lower electrode and on said upper surface of said other oxide film spacer, a capacitor upper electrode formed on an upper surface of said dielectric film, a third interlayer insulating film formed on an upper surface of said capacitor upper electrode, and a metal line layer formed on an upper surface of said third interlayer insulating film.

17. A stacked capacitor for a semiconductor memory connected to a diffusion layer of a transistor formed on a principal surface of a semiconductor substrate, said stacked capacitor comprising:

an interlayer insulating film formed smoothly on said principal surface of said semiconductor substrate so as to cover said transistor, a contact hole formed in said interlayer insulating film and extending to an upper surface of said diffusion layer, a plug filling at least part of said contact hole, said plug having a flat upper surface having no step portions with the flat upper surface being at a same height as a height of an upper surface of said interlayer insulating film as measured from said principal surface of said semiconductor substrate, a capacitor lower electrode formed on said upper surface of said plug and on said upper surface of said interlayer insulating film around said upper surface of said plug, a dielectric film formed on an upper surface of said capacitor lower electrode, a capacitor upper electrode formed on an upper surface of said dielectric film, and wherein said interlayer insulating film comprises at least two different type insulating films, with an outermost insulating film of said two different type insulating films having an etching rate slower than all etching rate of a film forming said plug, and with a innermost insulating film of said two different type insulating films has an etching rate faster than the etching rate of said film for forming said plug, and said dielectric film consists essentially of a ferrodielectric film or a high dielectric film.

18. The stacked capacitor of claim 17, wherein said lowest insulating film for forming said interlayer insulating film is a silicon oxide film having both boron and phosphorus as dopants, and said outermost insulating film for forming said interlayer insulating film is an another silicon oxide film not having said dopants.

19. The stacked capacitor of claim 17, further comprising:

an oxide film spacer formed smoothly on a side surface of said capacitor lower electrode and on an upper surface of said interlayer insulating film around said side surface of said capacitor lower electrode, so that said upper surface of said capacitor lower electrode may not sink from a position of said upper surface in an edge portion of said capacitor lower electrode, wherein said dielectric film is formed on said upper surface of said capacitor lower electrode and on an upper surface of said oxide film spacer.

20. A stacked capacitor of claim 17, further comprising:

an oxide film spacer formed on an entire surface of a side wall of said contact hole, said oxide film spacer having a smaller aperture than a diameter of said contact hole, and having an upper surface formed smoothly in the same height as a height of an upper surface of said interlayer insulating film from said principal surface of said semiconductor substrate, wherein said plug is formed so as to fill in said aperture of said oxide film spacer, and said capacitor lower electrode is formed on said upper surface of said plug, on said upper surface of said oxide film spacer, and on said upper surface of said interlayer insulating film.

21. The stacked capacitor of claim 20, further comprising:

an other oxide film spacer formed smoothly on a side surface of said capacitor lower electrode and on said upper surface of said interlayer insulating film around said side surface of said capacitor lower electrode, so that said upper surface of said capacitor lower electrode may not sink from a position of said upper surface in an edge portion of said capacitor lower electrode, wherein said dielectric film is formed on said upper surface of said capacitor lower electrode and on said upper surface of said other oxide film spacer.

22. A stacked capacitor for a semiconductor memory formed above an upper surface of an interlayer insulating film formed on a principal surface of a semiconductor substrate, comprising:

a capacitor lower electrode formed on said upper surface of said interlayer insulating film, an oxide film spacer formed smoothly on a side surface of said capacitor lower electrode and on said upper surface of said interlayer insulating film around a periphery of said side surface of said capacitor lower electrode, wherein a height of said oxide film spacer from said upper surface of said interlayer insulating film is higher than a height of an upper surface of said capacitor lower electrode from said upper surface of said interlayer insulating film, a dielectric film formed on said upper surface of said capacitor lower electrode, on said upper surface of said oxide film spacer, and on a side surface of said oxide film spacer projecting above said upper surface of said capacitor lower electrode, and a capacitor upper electrode formed on an upper surface of said dielectric film, wherein said dielectric film consists essentially of a ferrodielectric film or a high dielectric film.

23. The stacked capacitor of claim 22, wherein said oxide film spacer is formed by polishing and smoothing an oxide film formed to cover both a stopper film formed preliminarily on said upper surface of said capacitor lower electrode and said upper surface of said interlayer insulating film until said stopper film is a specified residual thickness of film by a chemical mechanical polishing method, and by eliminating the residual film of said stopper film.

* * * * *